United States Patent
Kim et al.

(10) Patent No.: US 9,191,015 B2
(45) Date of Patent: Nov. 17, 2015

(54) TEMPERATURE CONTROLLED OSCILLATOR AND TEMPERATURE SENSOR INCLUDING THE SAME

(71) Applicants: Sung-Jin Kim, Ulsan (KR); Jae-Jin Park, Seongnam-si (KR)

(72) Inventors: Sung-Jin Kim, Ulsan (KR); Jae-Jin Park, Seongnam-si (KR)

(73) Assignee: SAMSUNG ELECTRONICS CO., LTD., Gyeonggi-do (KR)

( * ) Notice: Subject to any disclaimer, the term of this patent is extended or adjusted under 35 U.S.C. 154(b) by 0 days.

(21) Appl. No.: 14/159,492

(22) Filed: Jan. 21, 2014

(65) Prior Publication Data

US 2014/0203879 A1    Jul. 24, 2014

(30) Foreign Application Priority Data

Jan. 21, 2013    (KR) .................. 10-2013-0006317

(51) Int. Cl.
*H03K 3/0231*    (2006.01)
*H03L 7/00*    (2006.01)
*H03L 1/02*    (2006.01)
*H03B 5/24*    (2006.01)

(52) U.S. Cl.
CPC .. *H03L 7/00* (2013.01); *H03B 5/24* (2013.01); *H03L 1/022* (2013.01)

(58) Field of Classification Search
USPC ................ 331/66, 113 R, 144, 176
See application file for complete search history.

(56) References Cited

U.S. PATENT DOCUMENTS

| | | | |
|---|---|---|---|
| 5,977,742 A | 11/1999 | Henmi | |
| 6,300,843 B1 * | 10/2001 | Kodama | 331/111 |
| 7,116,181 B2 * | 10/2006 | Bakker | 331/111 |
| 7,500,780 B2 | 3/2009 | Miki et al. | |
| 7,581,881 B2 | 9/2009 | Kim et al. | |
| 2009/0258383 A1 * | 10/2009 | Kovac et al. | 435/29 |
| 2010/0123510 A1 | 5/2010 | Yoshikawa | |
| 2010/0148067 A1 | 6/2010 | Cheon et al. | |
| 2010/0161868 A1 * | 6/2010 | Ueno | 710/308 |
| 2010/0329304 A1 * | 12/2010 | Doorenbos | 374/178 |
| 2011/0291807 A1 | 12/2011 | Law et al. | |

FOREIGN PATENT DOCUMENTS

| | | |
|---|---|---|
| JP | 08-083880 A | 3/1996 |
| JP | 11-262102 A | 9/1999 |
| JP | 2004-294356 A | 10/2004 |
| JP | 2006-208028 A | 8/2006 |
| JP | 2009-092447 A | 4/2009 |
| JP | 2010-154393 A | 7/2010 |
| KR | 1999-0004928 A | 1/1999 |
| KR | 10-0893103 B1 | 4/2009 |

* cited by examiner

*Primary Examiner* — Joseph Chang
(74) *Attorney, Agent, or Firm* — Harness, Dickey & Pierce, P.L.C.

(57) ABSTRACT

A temperature controlled oscillator includes an oscillation unit and a filter unit. The oscillation unit is configured to generate at least one reference voltage based on a supply voltage and a ground voltage, and to generate an oscillation signal having a period varying according to a temperature, the oscillation unit configured to generate the oscillation signal based on a filter voltage and the at least one reference voltage. The filter unit is configured to generate the filter voltage based on the oscillation signal.

24 Claims, 25 Drawing Sheets

500c

TEMPERATURE CONTROLLED OSCILLATOR AND TEMPERATURE SENSOR INCLUDING THE SAME

CROSS-REFERENCE TO RELATED APPLICATION

This application claims priority under 35 USC §119 to Korean Patent Application No. 2013-0006317, filed on Jan. 21, 2013, in the Korean Intellectual Property Office (KIPO), the contents of which are herein incorporated by reference in their entirety.

BACKGROUND

1. Technical Field

Example embodiments relate generally to semiconductor integrated circuits, and more particularly to temperature controlled oscillators and temperature sensors including the same.

2. Description of the Related Art

A system-on-chip (SoC) refers to a chip that integrates several semiconductor components therein, or a system integrated into the chip. As the degree of integration of the SoC is improved, a larger number of components are integrated into one chip, and the operating speed of the SoC is gradually increased. As the degree of integration and the operating speed of the SoC are increased, a greater amount of heat may be emitted within the SoC, and the temperature difference may be locally made within the SoC according to the operating conditions thereof. Accordingly, recently, the local temperature management or the local thermal monitor (LTM) of the SoC has been required.

SUMMARY

Accordingly, inventive concepts are provided to substantially obviate one or more problems due to limitations and disadvantages of the related art.

Some example embodiments provide a temperature controlled oscillator which can accurately and effectively generate an oscillation signal and can be implemented in a smaller and simpler configuration.

Some example embodiments provide a temperature sensor which can accurately detect temperature variation and can be implemented in a smaller and simpler configuration by employing the temperature controlled oscillator therein.

According to an example embodiment, a temperature controlled oscillator includes an oscillation unit and a filter unit. The oscillation unit generates at least one reference voltage based on a supply voltage and a ground voltage, and generates an oscillation signal having a period varying according to a temperature, the oscillation unit configured to generate the oscillation signal based on a filter voltage and the at least one reference voltage. The filter unit generates the filter voltage based on the oscillation signal. The filter unit including an on-chip metal resistor and a capacitor. The on-chip metal resistor has a first terminal connected with a first node, the on-chip metal resistor having a resistance value that varies according to the temperature. The capacitor has a first terminal connected with the first node, and configured to be charged or discharged based on the oscillation signal to supply the filter voltage.

The oscillation unit is configured to increase the period of the oscillation signal if the temperature is increased, and decrease the period of the oscillation signal if the temperature is decreased.

The oscillation unit may include a first resistor, a second resistor, a comparator and a third resistor. The first resistor may be connected between the supply voltage and a second node. The second resistor may be connected between the second node and the ground voltage. The comparator may include a first input terminal connected with the first node, a second input terminal connected with the second node, and an output terminal configured to output the oscillation signal. The third resistor may be connected between the second node and the output terminal of the comparator. A second terminal of the on-chip metal resistor may be connected with the output terminal of the comparator.

The oscillation unit is configured to generate a voltage at the second node as a first reference voltage, the first reference voltage may have one of a first reference level and a second reference level lower than the first reference level according to a level of the filter voltage, and the oscillation unit is configured to activate the oscillation signal if the level of the filter voltage is higher than the first reference level or the level of the filter voltage is lower than the second reference level.

The filter unit may further include an amplification block including a first terminal connected with a second terminal of the capacitor, a second terminal connected with the ground voltage, and a third terminal connected with the first node.

The oscillation unit may include a reference voltage generation block, an output block and a latch block. The reference voltage generation block may generate a first reference voltage and a second reference voltage in response to the supply voltage and the ground voltage. The output block may generate the oscillation signal based on the first reference voltage, the second reference voltage, the filter voltage, and a start signal. The latch block may latch and output the oscillation signal. A second terminal of the on-chip metal resistor may be connected with an output terminal of the latch block.

The reference voltage generation block may include a first resistor, a second resistor and a third resistor. The first resistor may be connected between the supply voltage and a second node. The second resistor may be connected between the second node and a third node. The third resistor may be connected between the third node and the ground voltage. A voltage at the second node may be s the first reference voltage, and a voltage at the third node may be the second reference voltage.

The output block may include a first comparator, a second comparator, a first NOR gate, an inverter and a second NOR gate. The first comparator may include a first input terminal configured to receive the first reference voltage, a second input terminal connected with the first node, and an output terminal configured to output a first comparative signal. The second comparator may include a first input terminal connected with the first node, a second input terminal configured to receive the second reference voltage, and an output terminal configured to output a second comparative signal. The first NOR gate may perform a NOR operation with respect to the first comparative signal and the second comparative signal. The inverter may invert the start signal. The second NOR gate may perform a NOR operation with respect to an output signal from the first NOR gate and an output signal from the inverter to generate the oscillation signal.

The oscillation unit activates the oscillation signal if a level of the filter voltage is higher than a level of the first reference voltage or lower than a level of the second reference voltage.

The latch block may include a flip-flop including a clock terminal configured to receive the oscillation signal, an output terminal connected with the on-chip metal resistor, and a data terminal connected with an inverting output terminal.

According to an example embodiment, a temperature controlled oscillator include an oscillation unit and a filter/frequency adjusting unit. The oscillation unit generates at least one reference voltage based on a supply voltage and a ground voltage, and generates an oscillation signal having a period that varies according to a temperature, the oscillation unit configured to generate the oscillation signal based on a filter voltage and the at least one reference voltage. An adjusting unit generates the filter voltage based on the oscillation signal and adjusts the period of the oscillation signal based on a correction control signal to remove an offset error included in the oscillation signal due to a parasitic delay of the oscillation unit.

The oscillation unit is configured to generate the oscillation signal including a first duration having a first period and a second duration having a second period longer than the first period, alternately repeated, and a number of first oscillation pulses for the first duration may be equal to a number of second oscillation pulses for the second duration.

The adjusting unit may include a first on-chip metal resistor, a second on-chip metal resistor, a select block and a capacitor. The first on-chip metal resistor may be connected between a first node and a second node, the first on-chip metal resistor have a resistance value that varies according to the temperature. The second on-chip metal resistor may be connected between the second node and a third node, the second on-chip metal resistor have a resistance value that varies according to the temperature. The select block may electrically connect one of the second node and the third node with an output terminal of the oscillation unit in response to the correction control signal. The capacitor may have a first terminal connected with the first node and configured to be charged or discharged based on the oscillation signal and the correction control signal to supply the filter voltage.

The first on-chip metal resistor and the second on-chip metal resistor may have a same resistance value, and the oscillation unit is configured to generate a first period and a second period of the oscillation signal based on the same resistance value.

The adjusting unit may include an on-chip metal resistor, a first capacitor, a second capacitor and a select block. The on-chip metal resistor may have a first terminal connected with a first node, the on-chip metal resistor having a resistance value that varies according to the temperature. The first capacitor may have a first terminal connected with the first node configured to be charged or discharged based on the oscillation signal to supply the filter voltage. The second capacitor may have a first terminal connected with the first node. The select block may selectively connect a second terminal of the first capacitor with a second terminal of the second capacitor in response to the correction control signal.

The first capacitor and the second capacitor may have a same capacitance, and the oscillation unit configured to generate a first period and a second period of the oscillation signal based on the same capacitance.

The adjusting unit may include a first on-chip metal resistor, a second on-chip metal resistor, a select block and a capacitor. The first on-chip metal resistor may have a first terminal connected with a first node, the first on-chip metal resistor having a resistance value that varies according to the temperature. The second on-chip metal resistor may be connected between the first node and a second node, the second on-chip metal resistor having a resistance value that varies according to the temperature. The select block may electrically connect one of the first node and the second node with a third node in response to the correction control signal. The capacitor may have a first terminal connected with the third node and configured to be charged or discharged based on the oscillation signal and the correction control signal to supply the filter voltage.

According to an example embodiment, a temperature sensor includes a temperature controlled oscillator and an analog-digital conversion circuit. The temperature controlled oscillator generates an oscillation signal having a period that varies according to a temperature of the oscillator. The analog-digital conversion circuit generates a digital output signal corresponding to the temperature based on the oscillation signal and a reference oscillation signal. The temperature controlled oscillator includes an oscillation unit and a filter unit. The oscillation unit generates at least one reference voltage based on a supply voltage and a ground voltage, and generates the oscillation signal based on a filter voltage and the at least one reference voltage. The filter unit generates the filter voltage based on the oscillation signal. The filter unit includes an on-chip metal resistor and a capacitor. The on-chip metal resistor has a first terminal connected with a first node, the on-chip metal resistor having a resistance value that varies according to the temperature. The capacitor has a first terminal connected to the first node, and is configured to be charged or discharged based on the oscillation signal to supply the filter voltage.

The analog-digital conversion circuit may include a local oscillator, a counter, a divider and a difference unit. The local oscillator may generate the reference oscillation signal. The counter may generate a sequentially increasing count increased based on the reference oscillation signal. The divider may generate a division signal by dividing the oscillation signal. The difference unit may generate the digital output signal by obtaining a count value of the count signal at every rising edge or every falling edge of the division signal.

The analog-digital conversion circuit may include a local oscillator, a divider, a counter and a register. The local oscillator may generate the reference oscillation signal. The divider may generate a division signal by dividing the oscillation signal. The counter may generate a sequentially increasing count signal based on the reference oscillation signal. The register may generate the digital output signal by obtaining a count value of the count signal at every rising edge or every falling edge of the division signal.

The analog-digital conversion circuit may include a local oscillator, a divider, a counter and a register. The local oscillator may generate the reference oscillation signal. The divider may generate a division signal by dividing the reference oscillation signal. The counter may generate a sequentially increasing count signal based on the oscillation signal. The register may generate the digital output signal by obtaining a count value of the count signal at every rising edge or every falling edge of the division signal.

According to an example embodiment, a temperature sensor includes a temperature controlled oscillator and an analog-digital conversion circuit. The temperature controlled oscillator generates an oscillation signal having a period that varies according to a temperature of the oscillator and adjusts the period of the oscillation signal based on a correction control signal. The analog-digital conversion circuit generates a first digital output signal corresponding to the temperature, and generates the correction control signal based on the oscillation signal and a reference oscillation signal. The temperature controlled oscillator includes an oscillation unit and a adjusting unit. The oscillation unit generates at least one reference voltage based on a supply voltage and a ground voltage, and generates the oscillation signal based on a filter voltage and the at least one reference voltage. The adjusting unit generates the filter voltage based on the oscillation signal and adjusts the period of the oscillation signal based on the correction control signal to remove an offset error included in the oscillation signal due to a parasitic delay of the oscillation unit.

The analog-digital conversion circuit may include a local oscillator, a counter, a first divider, a first difference unit, a second difference unit and a second divider. The local oscillator may generate the reference oscillation signal. The counter may generate a sequentially increasing count signal based on the reference oscillation signal. The first divider may generate a division signal based on the oscillation signal. The first difference unit may generate a second digital output signal by obtaining a count value of the count signal at every rising edge or every falling edge of the division signal. The second difference unit may generate the first digital output signal by obtaining a value of the second digital output signal at every rising edge or every falling edge of the division signal. The second divider may generate the correction control signal by dividing the division signal.

The temperature sensor may further include a gain correction circuit. The gain correction circuit is configured to remove the offset error and a gain error and generate the second digital output signal, based on the first digital output signal and a reference output signal.

The gain correction circuit may include a first operation unit, a storage unit and a second operation unit. The first operation unit may calculate a gain correction value by dividing the reference output signal by the first digital output signal. The storage unit may store the gain correction value. The second operation unit may generate the second digital output signal by multiplying the first digital output signal by the gain correction value.

As described above, the temperature controlled oscillator according to example embodiments includes the on-chip metal resistor so the temperature controlled oscillator may have a smaller and simpler configuration and can accurately and effectively generate the oscillation signal having the period proportional to the temperature. In addition, the temperature controlled oscillator can adjust the period of the oscillation signal based on the correction control signal in order to effectively remove the offset error from the oscillation signal.

As described above, the temperature sensor according to example embodiments includes the temperature controlled oscillator having the on-chip metal resistor, so the temperature sensor may have a smaller and simpler configuration and can accurately and effectively generate the digital output signal proportional to the temperature. In addition, the temperature sensor can improve the accuracy and the reliability of the digital output signal by removing the offset error caused by parasitic delay and/or the gain error caused by RC variation.

In at least one example embodiment, a system-on-chip (SoC) includes an oscillator configured to generate an oscillation signal having a period proportional to a temperature of the oscillator, the oscillator including, a filter including at least one on-chip resistor, the at least one on-chip resistor configured such that a resistance of the at least one on-chip resistor is based on the temperature, the filter configured to generate a filter voltage based on the resistance of the at least one on-chip resistor, and an oscillation unit configured to generate the oscillation signal based on the filter voltage.

The at least one on-chip resistor may be metal.

The oscillation unit may include a comparator configured to compare the filter voltage and a reference voltage and output the oscillation signal based on the comparison.

The oscillation unit may include first, second and third resistors connected together at a common node, the reference voltage being based on resistances of the first, second and third resistors, respectively.

The filter may include first and second on-chip resistors, resistances of the first and second on-chip resistors, respectively, are based on the temperature, and the filter is configured to generate the filter voltage based on the resistances of the first and second on-chip resistors.

The first and second on-chip resistors may be metal.

The filter may include a selector configured to connect an output of the oscillation signal to the filter based on a correction control signal.

BRIEF DESCRIPTION OF THE DRAWINGS

Illustrative, non-limiting example embodiments will be more clearly understood from the following detailed description taken in conjunction with the accompanying drawings.

DETAILED DESCRIPTION OF EXAMPLE EMBODIMENTS

Figure 1:
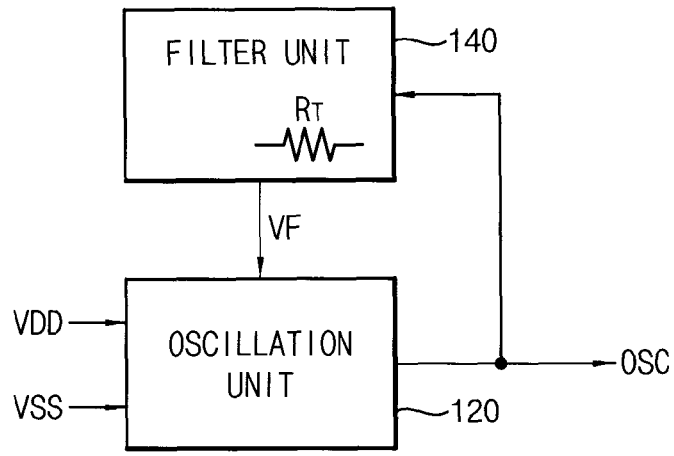
FIG. 1 is a diagram illustrating a temperature controlled oscillator according to at least one example embodiment.

Various example embodiments will be described more fully with reference to the accompanying drawings, in which embodiments are shown. Inventive concepts may, however, be embodied in many different forms and should not be construed as limited to the embodiments set forth herein. Rather, these embodiments are provided so that this disclosure will be thorough and complete, and will fully convey the scope of inventive concepts to those skilled in the art. Like reference numerals refer to like elements throughout this application.

It will be understood that, although the terms first, second, etc. may be used herein to describe various elements, these elements should not be limited by these terms. These terms are used to distinguish one element from another. For example, a first element could be termed a second element, and, similarly, a second element could be termed a first element, without departing from the scope of inventive concepts. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments and is not intended to be limiting of inventive concepts. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, and/or components, but do not preclude the presence or addition of one or more other.

Unless otherwise defined, all terms (including technical and scientific terms) used herein have the same meaning as commonly understood by one of ordinary skill in the art to which inventive concepts belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a diagram illustrating a temperature controlled oscillator according to at least one example embodiment.

Referring to FIG. 1, a temperature controlled oscillator (TCO) 100 includes an oscillation unit 120 and a filter unit 140.

The oscillation unit 120 generates at least one reference voltage based on a supply voltage VDD and a ground voltage VSS, and generates an oscillation signal OSC based on a filter voltage VF and at least one reference voltage. The oscillation signal OSC has a period varying depending on temperature variation.

In one example embodiment, the period of the oscillation signal OSC is increased if the temperature is increased, and decreased if the temperature is decreased. In other words, the period of the oscillation signal OSC may be proportional to the temperature. In another example embodiment, the period of the oscillation signal OSC may be decreased if the temperature is increased, and may be increased if the temperature is decreased.

The filter unit 140 generates the filter voltage VF based on the oscillation signal OSC. The filter unit 140 may be implemented in the form of an RC filter including at least one resistor and at least one capacitor. For example, the filter unit 140 may include a first order low pass filter (LPF) including one resistor and one capacitor. In this case, a first terminal of the resistor and a first terminal of the capacitor are connected with a first node to which the filter voltage VF is applied. A node connected with a second terminal of the resistor and a node connected with a second terminal of the capacitor may be variously changed according to example embodiments. In addition, a resistor $R_T$ included in the filter unit 140 may be an on-chip metal resistor $R_T$ including metal, which is integrated on a semiconductor substrate together with a circuit and/or a system including the temperature controlled oscillator 100.

The temperature controlled oscillator 100 according to example embodiments includes the on-chip metal resistor $R_T$. When comparing with a different material such as polycrystal, the resistance value of the metal has a superior linearity, so that the temperature controlled oscillator 100 can accurately and effectively generate the oscillation signal OSC having a period proportional to the temperature. In addition, as the resistor $R_T$ is integrated on the substrate together with the circuit and/or the system, the temperature controlled oscillator 100 has the smaller and simpler configuration. In addition, the temperature controlled oscillator can be implemented at the lower manufacturing cost.

Hereinafter, various example embodiments of a temperature controlled oscillator will be described in more detail.

Figure 2:
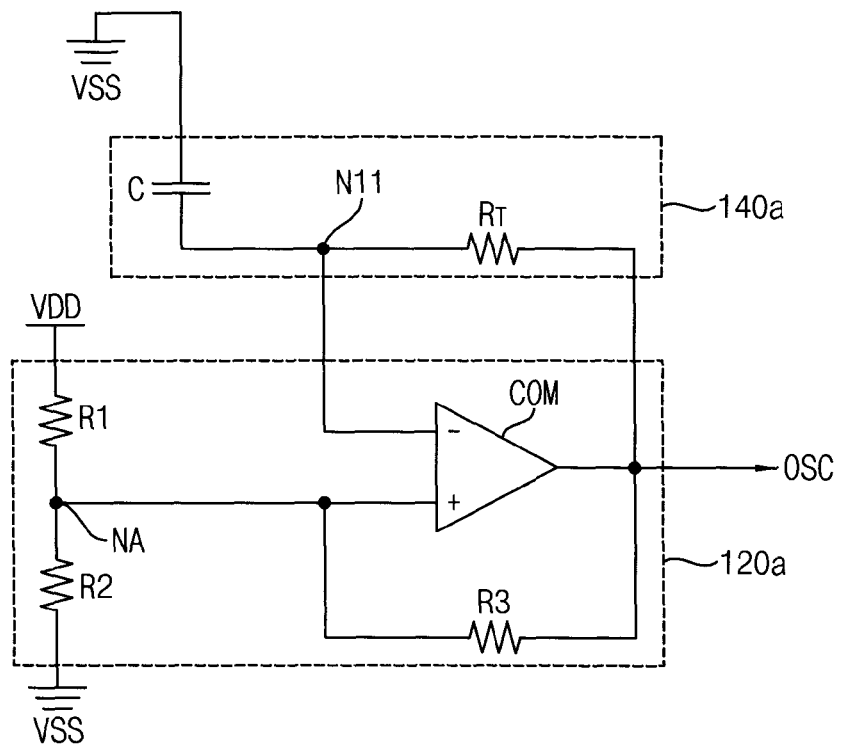
FIG. 2 is a circuit diagram illustrating one example of the temperature controlled oscillator of FIG. 1.

FIG. 2 is a circuit diagram illustrating one example of the temperature controlled oscillator of FIG. 1.

Referring to FIG. 2, a temperature controlled oscillator 100a includes an oscillation unit 120a and a filter unit 140a.

The filter unit 140a includes an on-chip metal resistor $R_T$ and a capacitor C. The on-chip metal resistor R has a first terminal connected with a first node N11, and a second terminal connected with an output terminal of the oscillation unit 120a (i.e., an output terminal of a comparator COM). The on-chip metal resistor $R_T$ has a resistance value linearly varying depending on the temperature variation. The capacitor C has a first terminal connected with the first node N11, and a second terminal connected with ground voltage VSS. The capacitor C is charged or discharged based on the oscillation signal OSC to supply filter voltage VF. The voltage at the first node N11 may serve as the filter voltage VF.

The oscillation unit 120a may include a first resistor R1, a second resistor R2, the comparator COM, and a third resistor R3. The first resistor R1 may be connected between supply voltage VDD and a second node NA. The second resistor R2 may be connected between the second node NA and the terminal of the ground voltage VSS. The voltage at the second node NA may serve as a first reference voltage. The comparator COM may include a first input terminal connected with the first node N11 to receive the filter voltage VF, a second input terminal connected with the second node NA to receive the first reference voltage, and the output terminal to output the oscillation signal OSC. The third resistor R3 may be connected between the second node NA and the output terminal of the comparator COM. The number of resistors included in the oscillation unit 120a and the ratio between the resistance values may be variously changed according to the example embodiments.

Figure 3:
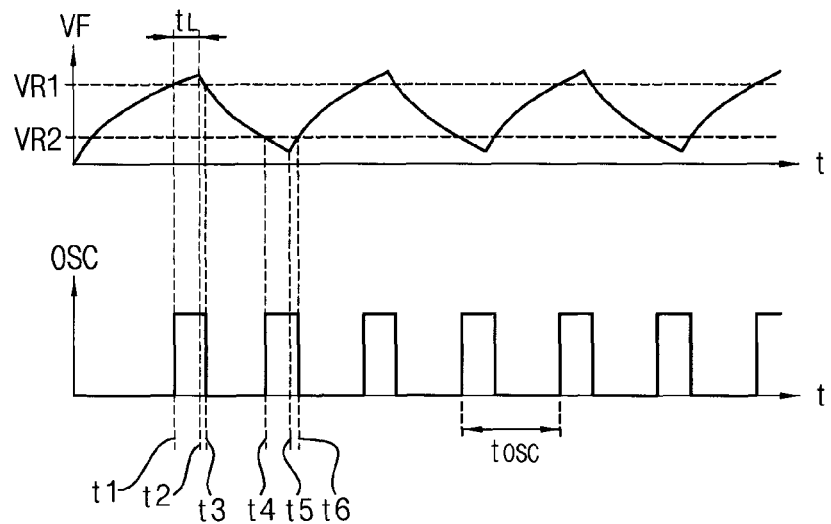
FIG. 3 is a timing diagram illustrating the operation of the temperature controlled oscillator of FIG. 2.

FIG. 3 is a timing diagram illustrating the operation of the temperature controlled oscillator 100a of FIG. 2.

Referring to FIGS. 2 and 3, the first reference voltage may have a first reference level VR1 or a second reference level VR2 which is lower than the first reference level VR1. The first and second reference levels VR1 and VR2 may be determined depending on the resistance values of the first to third resistors R1 to R3. For example, when the ratio among the resistance value of the first resistor R1, the resistance value of the second resistor R2, and the resistance value of the third resistor R3 is about 2:2:1, the first reference level VR1 may be about VDD×3/4, and the second reference level VR2 may be about VDD/4. The first and second reference levels VR1 and VR2 may be variously changed.

The temperature controlled oscillator 100a may operate in a stable state. The capacitor C is charged to the first reference level VR1 through the on-chip metal resistor RT. As soon as the voltage across the capacitor C (i.e., the filter voltage VF) reaches the first reference level VR1, the capacitor C starts to be discharged. The capacitor C may be discharged until the voltage across the capacitor C reaches the second reference level VR2. As soon as the voltage across the capacitor C reaches the second reference level VR2, the capacitor C starts to be charged again. The capacitor C may be charged until the voltage across the capacitor C reaches the first reference level VR1. In this case, since parasitic delay (or loop delay) exists due to the oscillation unit 120a, particularly the comparator COM, even if the filter voltage VF reaches the first reference level VR1, the capacitor C is further charged by the delay time. In addition, even if the filter voltage VF reaches the second reference level VR2, the capacitor C may be further discharged by the delay time. The parasitic delay may correspond to delay between the input and the output of the comparator COM.

In detail, as the capacitor C is charged, the filter voltage VF is exponentially increased to the first reference level VR1. Even though the filter voltage VF reaches the first reference level VR1 at time t1, the filter voltage VF is further increased during the delay time $t_L$ after the time t1 due to the parasitic delay of the oscillation unit 120a. After the delay time $t_L$ has elapsed, the capacitor C starts to be discharged at time t2, and the filter voltage VF is exponentially decreased to the second reference level VR2. Even though the filter voltage VF reaches the second reference level VR2 at time t4, the filter voltage VF is further decreased during the delay time $t_L$ after the time t4 due to the parasitic delay of the oscillation unit 120a. After the delay time $t_L$ has elapsed, the capacitor C starts to be charged at time t5. In this case, the oscillation signal OSC is activated or deactivated according to the comparative operation of the comparator COM, and is activated when the level of the filter voltage VF is higher than the first reference level VR1 (e.g., for the duration between time t1 to t3), or lower than the second reference level VR2 (e.g., for the duration between time t4 to t6).

Meanwhile, in the first order LPF including one resistor and one capacitor, the response characteristic of the filter depends on a time constant based on the resistance value of the resistor and the capacitance of the capacitor. According to the first order LPF, time $t_x$ required until the output voltage of the filter reaches specific voltage $V_x$ may satisfy following Equation 1. The period $t_{osc}$ of the oscillation signal OSC generated from the temperature controlled oscillator 100a may be expressed as following Equation 2, based on following Equation 1 and the delay time $t_L$ caused by the parasitic delay of the oscillation unit 120a.

$$V_x = VDD(1 - e^{-\frac{t_x}{RC}})$$ Equation 1

$$t_{OSC} = 2R_TC\ln\left(4e^{\frac{t_L}{R_TC}} - 1\right)$$ Equation 2
$$= 2R_TC\ln 3$$
(when $R_TC >> t_L$)

In Equation 1, $R_T$ and C represent the resistance value of the resistor and the capacitance of the capacitor, which typically constitute the first order LPF, respectively. In Equation 2, $R_T$ and C represent the resistance value of the on-chip metal resistor $R_T$ and the capacitance of the capacitor C, which constitute the filter unit 140a of the temperature controlled oscillator 100a.

The temperature controlled oscillator 100a generates the oscillation signal OSC having the period proportional to the resistance value of the on-chip metal resistor $R_T$. As described above, since the resistance value of the on-chip metal resistor $R_T$ has the superior linearity with respect to the temperature variation, the temperature controlled oscillator 100a may generate the oscillation signal OSC having the period more exactly proportional to the temperature.

Figure 4:
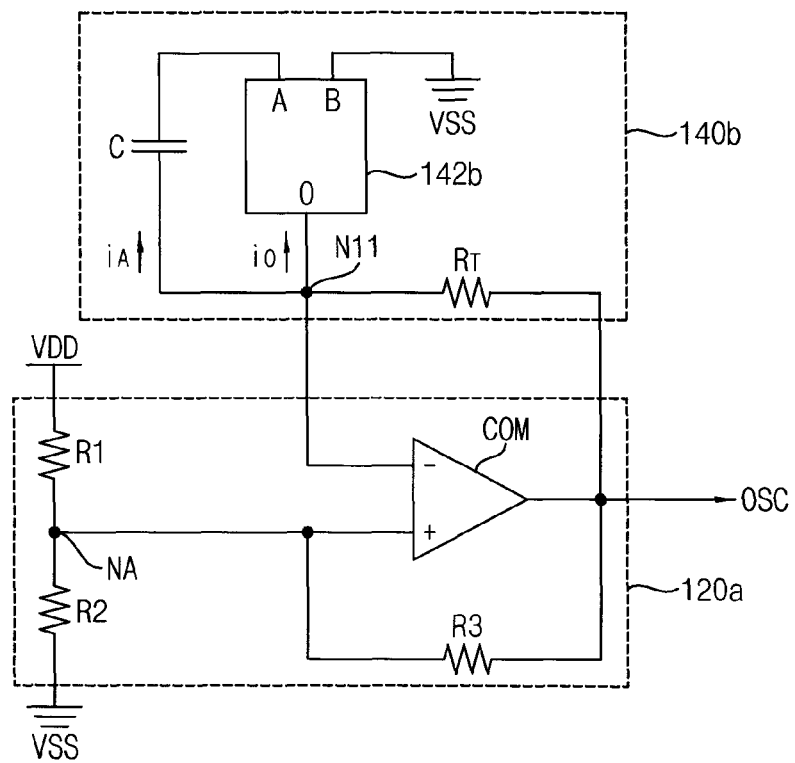
FIG. 4 is a circuit diagram illustrating another example of the temperature controlled oscillator of FIG. 1.

FIG. 4 is a circuit diagram illustrating another example of a temperature controlled oscillator of FIG. 1.

Referring to FIG. 4, a temperature controlled oscillator 100b includes the oscillation unit 120a and a filter unit 140b.

Since the temperature controlled oscillator 100b of FIG. 4 is substantially identical to the temperature controlled oscillator 100a of FIG. 2 except that the filter unit 140b has a modified configuration, and operates as illustrated in FIG. 3, the details thereof will be omitted in order to avoid redundancy.

The filter unit 140b includes an on-chip metal resistor $R_T$ and a capacitor C, and may further include an amplification block 142b. The on-chip metal resistor $R_T$ has a first terminal connected with a first node N11, and a second terminal connected with an output terminal of a comparator COM. The capacitor C has a first terminal connected with the first node N11 and a second terminal connected with a first terminal A of the amplification block 142b. The amplification block 142b may include the first terminal A connected with the second terminal of the capacitor C, a second terminal B connected with the terminal of ground voltage VSS, and a third terminal O connected with the first node N11.

The relationships among voltages $V_A$, $V_B$, and $V_O$ and currents $i_A$, $i_B$, and $i_O$ of the ports A, B, and C of the amplification block 142b satisfy following Equation 3, and the equivalent capacitance $C_{eq}$ between the amplification block 142b and the capacitor C may satisfy following Equation 4.

$$\begin{bmatrix} V_A \\ i_B \\ i_O \end{bmatrix} = \begin{bmatrix} 1 & 0 & 0 \\ 0 & 0 & 0 \\ 0 & k & 0 \end{bmatrix} \begin{bmatrix} V_B \\ i_A \\ V_O \end{bmatrix} \quad \text{Equation 3}$$

$$C_{eq} = (1+k)C \quad \text{Equation 4}$$

In above Equation 3 and Equation 4, k represents a real number.

The Mille Effect, in which the capacitance of the capacitor C is multiplied, may occur due to the amplification block 142b. The filter unit 140b is implemented to include a Miller capacitor including the capacitor C and the amplification block 142b, thereby reducing the area of the filter unit 140b and the size of the temperature controlled oscillator 100b.

Figure 5:
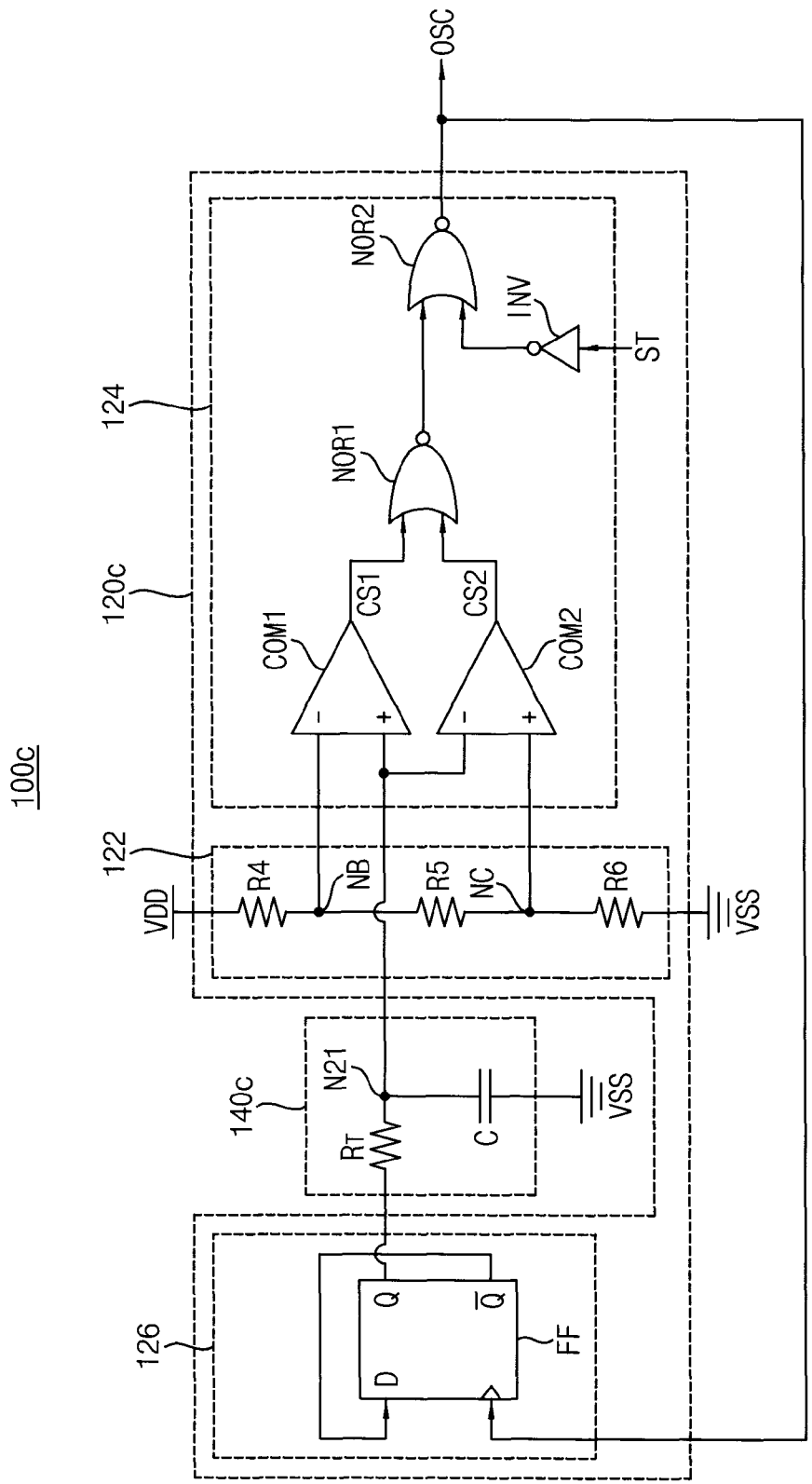
FIG. 5 is a circuit diagram illustrating still another example of the temperature controlled oscillator of FIG. 1.

FIG. 5 is a circuit diagram illustrating still another example of the temperature controlled oscillator of FIG. 1.

Referring to FIG. 5, a temperature controlled oscillator 100c includes an oscillation unit 120c and a filter unit 140c.

The filter unit 140c includes an on-chip metal resistor $R_T$ and a capacitor C. The on-chip metal resistor $R_T$ has a first terminal connected with a first node N21, and a second terminal connected with an output terminal of a latch block 126. The on-chip metal resistor $R_T$ has a resistance value linearly varying depending on temperature variation. The capacitor C has a first terminal connected with the first node N21 and a second terminal connected with the terminal of ground voltage VSS. The capacitor C is charged or discharged based on an oscillation signal OSC to supply filter voltage VF. The voltage at the first node N21 may serve as the filter voltage VF.

The oscillation unit 120c may include a reference voltage generation block 122, an output block 124, and the latch block 126. The reference voltage generation block 122 may generate first reference voltage and second reference voltage in response to supply voltage VDD and ground voltage VSS. The output block 124 may generate the oscillation signal OSC based on the first reference voltage, the second reference voltage, the filter voltage VF, and a start signal ST. The latch block 126 may latch and output the oscillation signal OSC.

The reference voltage generation block 122 may include a first resistor R4, a second resistor R5, and a third resistor R6. The first resistor R4 may be connected between the supply voltage VDD and a second node NB. The second resistor R5 may be connected between the second node NB and a third node NC. The third resistor R6 may be connected between the third node NC and the terminal of the ground voltage VSS. The voltage at the second node NB may serve as the first reference voltage, and the voltage at the third node NC may serve as the second reference voltage. The number of resistors included in the reference voltage generation block 122 and the ratio among the resistance values may be variously changed according to the example embodiments.

The output block 124 may include a first comparator COM1, a second comparator COM2, a first NOR gate NOR1, an inverter INV, and a second NOR gate NOR2. The first comparator COM1 may include a first input terminal connected with the second node NB to receive the first reference voltage, a second input terminal connected with the first node N21 to receive the filter voltage VF, and an output terminal to output a first comparative signal CS1 resulting from the comparison of the first reference voltage with the filter voltage VF. The second comparator COM2 may include a first terminal connected with the first node N21 to receive the filter voltage VF, a second input terminal connected with the third node NC to receive the second reference voltage, and an output terminal to output a second comparative signal CS2 resulting from the comparison of the second reference voltage with the filter voltage VF. The first NOR gate NOR1 may perform a NOR operation for the first and second comparative signals CS1 and CS2. The inverter INV may invert and output the start signal ST. The second NOR gate NOR2 performs a NOR operation for an output signal of the first NOR gate NOR1 and an output signal of the inverter INV to generate the oscillation signal OSC. The output block 124 may have various configurations according to example embodiments.

The latch block 126 may include a flip-flop FF. The flip-flop FF may include a clock terminal to receive the oscillation signal OSC, an output terminal Q connected with the second terminal of the on-chip metal resistor RT, and a data terminal D connected with an inverted output terminal /Q. Since the data terminal D is connected with the inverted output terminal /Q, the signal output from the output terminal Q of the flip-flop FF may be toggled at every rising edge of the oscillation signal OSC applied to the clock terminal Q. Although FIG. 5 illustrates that the flip-flop FF is a D flip-flop, various types of flip-flops may be employed according to the example embodiments.

Figure 6:
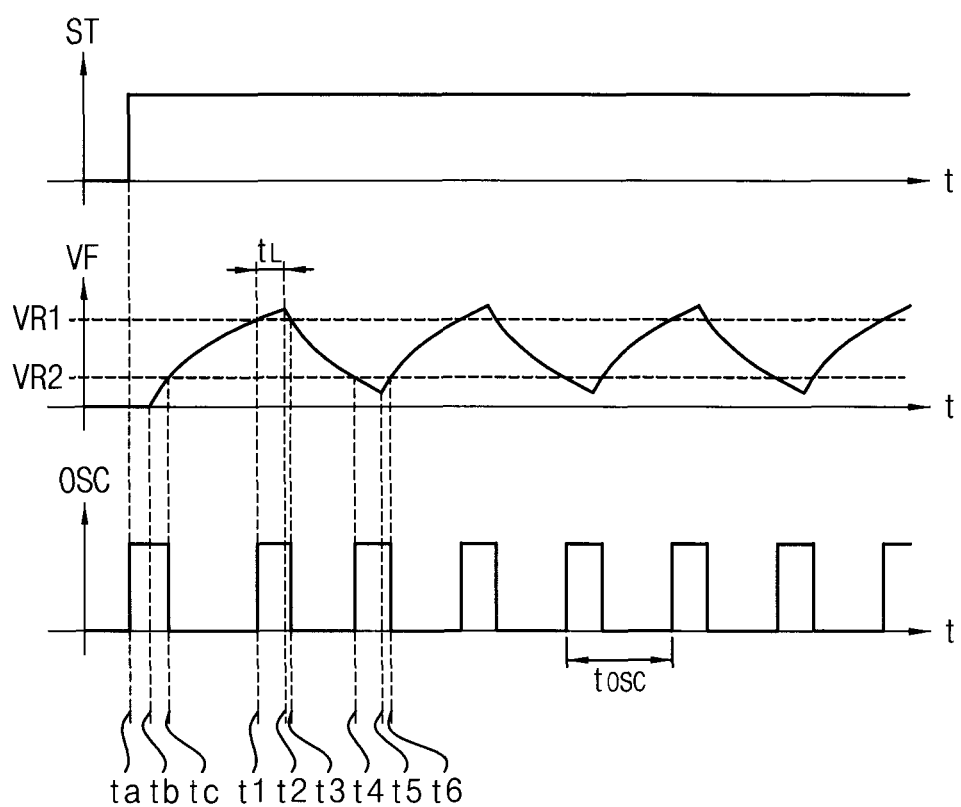
FIG. 6 is a timing diagram illustrating the operation of the temperature controlled oscillator of FIG. 5.

FIG. 6 is a timing diagram illustrating the operation of the temperature controlled oscillator of FIG. 5.

Referring to FIGS. 5 and 6, the level (i.e., the first reference level VR1) of the first reference voltage may be higher than the level (i.e., the second reference level VR2) of the second reference voltage. The first and second reference levels VR1 and VR2 may be determined depending on resistance values of the first to third resistors R4 to R6. For example, when the ratio among the first resistor R4, the second resistor R5, and the third resistor R6 is about 1:2:1, the first reference level VR1 may be about VDD×3/4, and the second reference level VR2 may be about VDD/4. The first and second reference levels VR1 and VR2 may be variously changed according to example embodiments.

The temperature controlled oscillator 100c may be driven only when the start signal ST is activated. For example, at time ta, the start signal ST is activated, so that the oscillation signal OSC is activated. At time tb, the capacitor C starts to be charged. At time tc, the voltage (i.e., filter voltage VF) across the capacitor C becomes higher than the second reference level VR2, and the oscillation signal OSC is deactivated.

The operation of the temperature controlled oscillator 100c after the time tc may be substantially identical to the operation described with reference to FIG. 3. For example, as the capacitor C is charged, the filter voltage VF is exponentially increased to the first reference level VR1. Even though the filter voltage VF reaches the first reference level VR1 at time t1, the filter voltage VF is further increased during the delay time $t_L$ after the time t1 due to the parasitic delay (i.e., the parasitic delay caused by the comparators COM1 and COM2, the logic devices NOR1, NOR2, and INV, and the flip-flop FF) of the oscillation unit 120c. After the delay time $t_L$ has elapsed, the capacitor C starts to be discharged at time t2, and the filter voltage VF is exponentially decreased to the second reference level VR2. Even though the filter voltage VF reaches the second reference level VR2 at time t4, the filter voltage VF is further decreased during the delay time $t_L$ after the time t4 due to the parasitic delay of the oscillation unit 120c. After the delay time $t_L$, has elapsed, the capacitor C starts to be charged again at time t5. In this case, the oscillation signal OSC is activated when the level of the filter voltage VF is higher than the first reference level VR1 (e.g., for the duration between time t1 to t3), or lower than the second reference level VR2 (e.g., for the duration between time t4 to t6). The period $t_{osc}$ of the oscillation signal OSC generated from the temperature controlled oscillator 100c may be expressed as Equation 2. The parasitic delay may correspond to delay between the input and the output of each of the comparators COM1 and COM2, the logic devices NOR1, NOR2, and INV, and the flip-flop FF.

Figure 7:
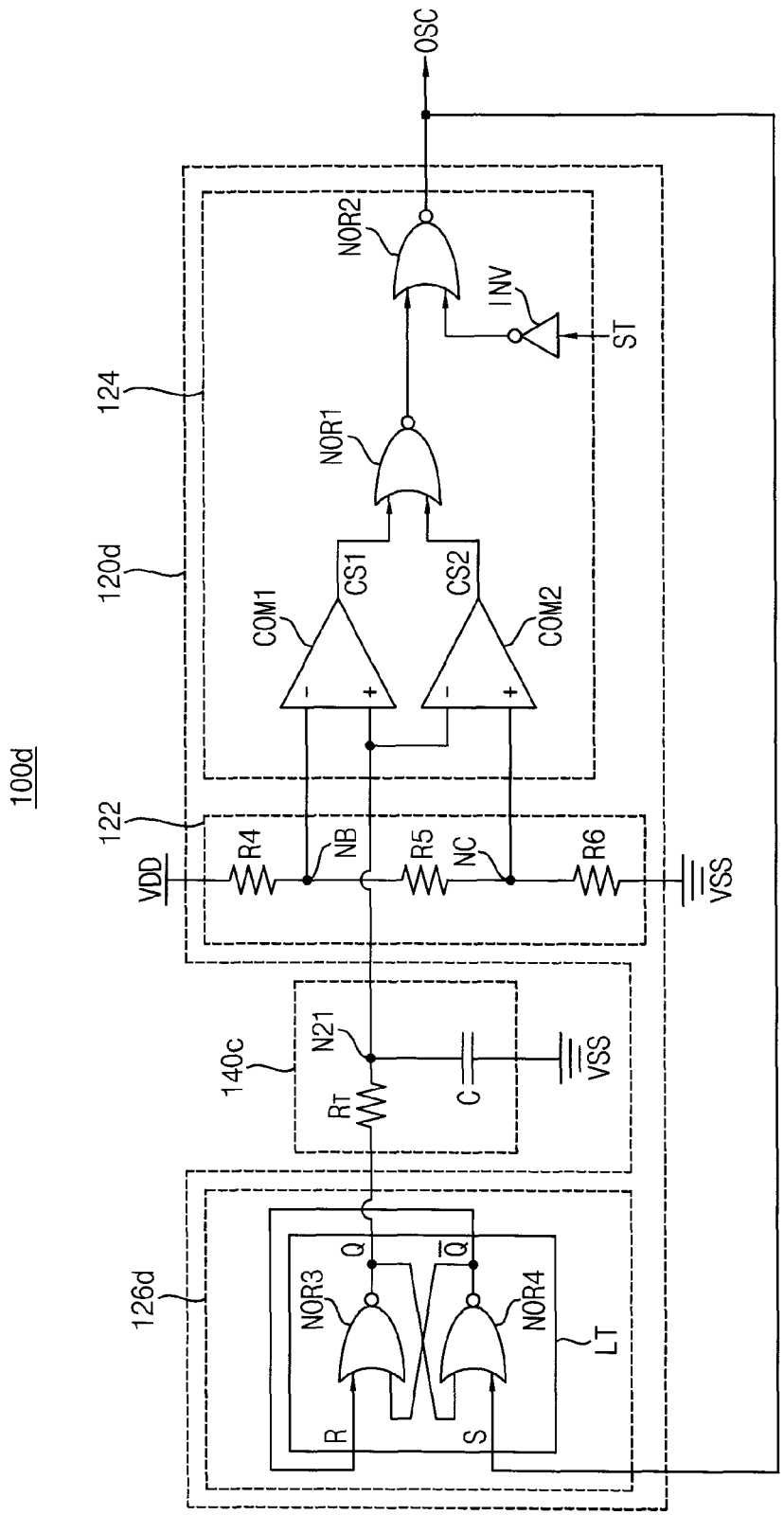
FIGS. 7 and 8 are circuit diagrams illustrating still yet other examples of the temperature controlled oscillator of FIG. 1.
Figure 8:
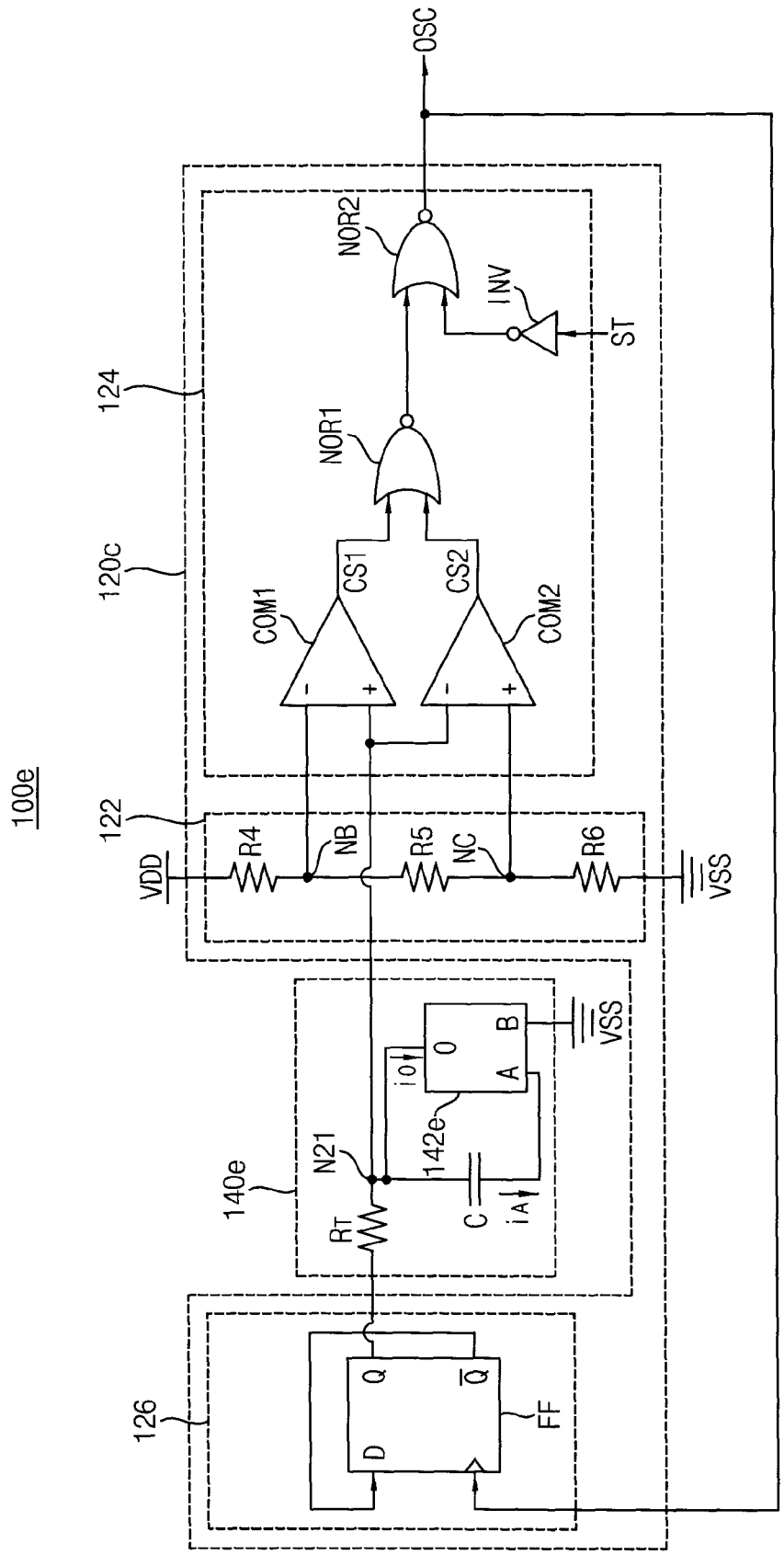

FIGS. 7 and 8 are circuit diagrams illustrating still yet other examples of the temperature controlled oscillator of FIG. 1.

Referring to FIG. 7, a temperature controlled oscillator 100d includes an oscillation unit 120d and the filter unit 140c.

The temperature controlled oscillator 100d of FIG. 7 is substantially identical to the temperature controlled oscillator 100c of FIG. 5 except that a latch block 126d has a modified configuration, and operates as illustrated in FIG. 6.

The oscillation unit 120d may include the reference voltage generation block 122, the output block 124, and a latch block 126d. The latch block 126d latches and outputs an oscillation signal OSC, and may include a latch LT. The latch LT may include a set terminal S to receive the oscillation signal OSC, an output terminal Q connected with a second terminal of an on-chip metal resistor $R_T$, and a reset terminal R connected with an inverted output terminal Q. The latch LT may include a third NOR gate NOR3 and a fourth NOR gate NOR4 having inputs and outputs mutually connected with each other. Although FIG. 7 illustrates that the latch LT is a set-latch S-R, the type of the latch LT may be variously changed according to example embodiments.

Referring to FIG. 8, a temperature controlled oscillator 100e includes an oscillation unit 120c and a filter unit 140e.

The temperature controlled oscillator 100e of FIG. 8 is substantially identical to the temperature controlled oscillator 100c of FIG. 5 except that a filter unit 140e has a modified configuration, and operates as illustrated in FIG. 6.

The filter unit 140e includes an on-chip metal resistor $R_T$ and a capacitor C, and may include an amplification block 142e. The amplification block 142e may include a first terminal A connected with a second terminal of the capacitor C, a second terminal B connected with the terminal of ground voltage VSS, and a third terminal C connected with a first node N21. The filter unit 140e is implemented to include a Miller capacitor including the capacitor C and the amplification block 142e, thereby reducing the area of the filter unit 140e and the size of the temperature controlled oscillator 100e.

Figure 9:
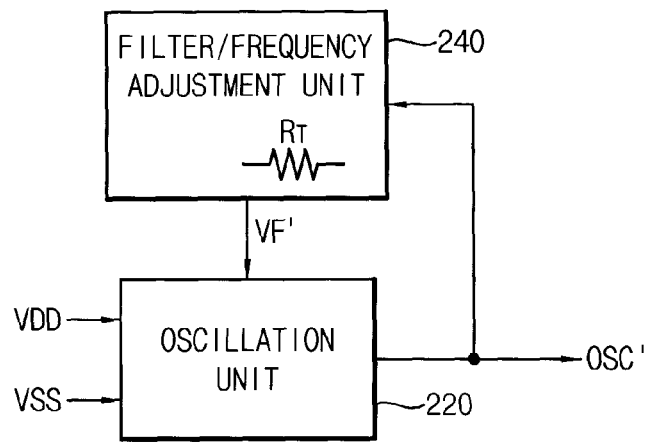
FIG. 9 is a diagram illustrating a temperature controlled oscillator according to example embodiments.

FIG. 9 is a diagram illustrating a temperature controlled oscillator according to at least one example embodiment.

Referring to FIG. 9, a temperature controlled oscillator 200 includes an oscillation unit 220, and a filter/frequency adjusting unit 240.

The oscillation unit 220 generates at least one reference voltage based on supply voltage VDD and ground voltage VSS, and generates an oscillation signal OSC' based on filter voltage VF' and the at least one reference voltage. The oscillation signal OSC' has a period varying depending on temperature variation.

The filter/frequency adjusting unit 240 generates the filter voltage VF' based on the oscillation signal OSC'. In order to remove offset errors from the oscillation signal OSC', the filter/frequency adjusting unit 240 adjusts the period of the oscillation signal OSC' based on a correction control signal CCON. The offset error is included in the oscillation signal OSC' due to the parasitic delay of the oscillation unit 220. The filter/frequency adjusting unit 240 may be implemented in the form of a first order LPF. A resistor included in the filter/frequency adjusting unit 240 may be integrated on the same semiconductor device together with a circuit and/or system including the temperature controlled oscillator 200, and may include an on-chip metal resistor $R_T$ including a metallic material.

According to one example embodiment, in the oscillation signal OSC', first and second durations may be alternately repeated based on the correction control signal CCON. The oscillation signal OSC' may have a first period for the first duration, and may have a second period longer than the first period for the second duration. The number of first oscillation pulses for the first duration may be substantially equal to the number of second oscillation pulses for the second duration.

Since the temperature controlled oscillator 200 according to example embodiments includes the on-chip metal resistor $R_T$ integrated with a semiconductor substrate together with a circuit and/or a system while representing the superior linearity with respect to the temperature variation, the temperature controlled oscillator 200 can accurately and effectively generate the oscillation signal OSC' having a period proportional to the temperature and have the smaller and simpler configuration. In addition, the temperature controlled oscillator 200 can adjust the period of the oscillation signal OSC' based on the correction control signal CCON in order to effectively remove an offset error from the oscillation signal OSC'.

Hereinafter, various example embodiments of a temperature controlled oscillator will be described in more detail.

Figure 10:
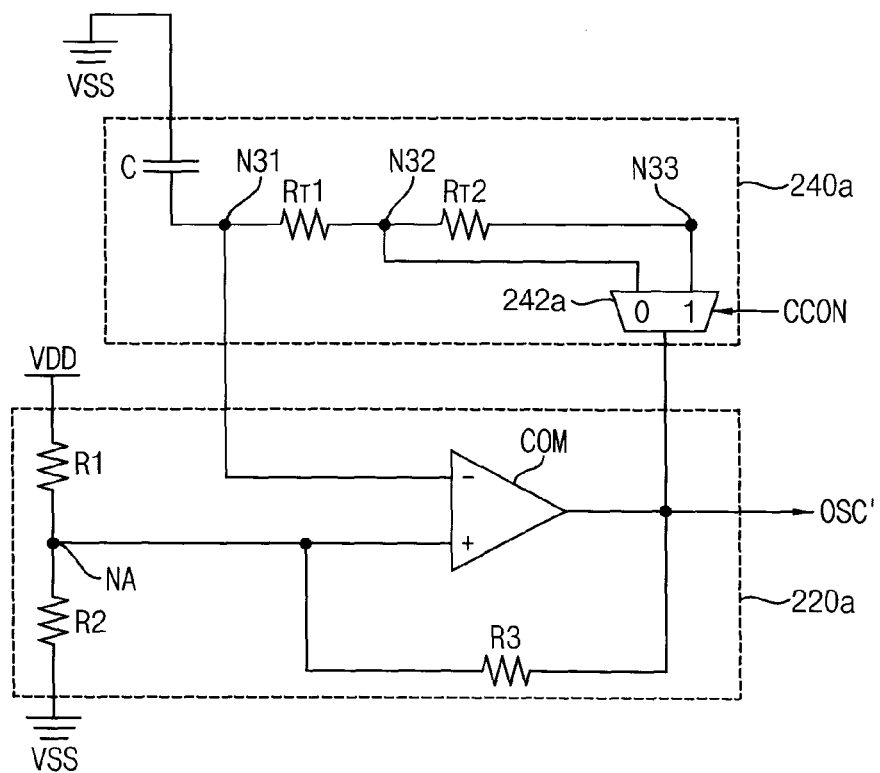
FIG. 10 is a circuit diagram illustrating one example of the temperature controlled oscillator of FIG. 9.

FIG. 10 is a circuit diagram illustrating one example of the temperature controlled oscillator of FIG. 9.

Referring to FIG. 10, a temperature controlled oscillator 220a includes an oscillation unit 220a and a filter/frequency adjusting unit 240a.

The filter/frequency adjusting unit 240a may include a first on-chip metal resistor $R_T1$, a second on-chip metal resistor $R_T2$, a select block 242a, and a capacitor C. The first on-chip metal resistor $R_T1$ may be connected between a first node N31 and a second node N32, and the second on-chip metal resistor $R_T2$ may be connected between the second node N32 and a third node N33. The first and second on-chip metal resistors $R_T1$ and $R_T2$ may have resistance values linearly varying depending on temperature variation. The select block 242a may electrically connect one of the second and third nodes N32 and N33 with an output terminal (i.e., an output terminal of a comparator COM) of the oscillation unit 220a in response to the correction control signal CCON. For example, the select block 242a may include a multiplexer, and may be implemented in the form of a switch according to example embodiments. The capacitor C has a first terminal connected with the first node N31, and a second terminal connected to the terminal of ground voltage VSS. The capacitor C may be charged or discharged based on the oscillation signal OSC' and the correction control signal CCON to supply filter voltage VF'. The voltage at the first node N31 may serve as the filter voltage VF'.

The oscillation unit 220a may be substantially identical to the oscillation unit 120a included in the temperature controlled oscillator 100a of FIG. 2. In other words, the oscillation unit 220a may include a first resistor R1 connected between supply voltage VDD and a node NA, a second resistor R2 connected between the node NA and the terminal of ground voltage VSS, a comparator COM having a first input terminal connected with the first node N31, a second input terminal connected with the node NA, and an output terminal to output the oscillation signal OSC', and a third resistor R3 connected between the node NA and the output terminal of the comparator COM.

Figure 11:
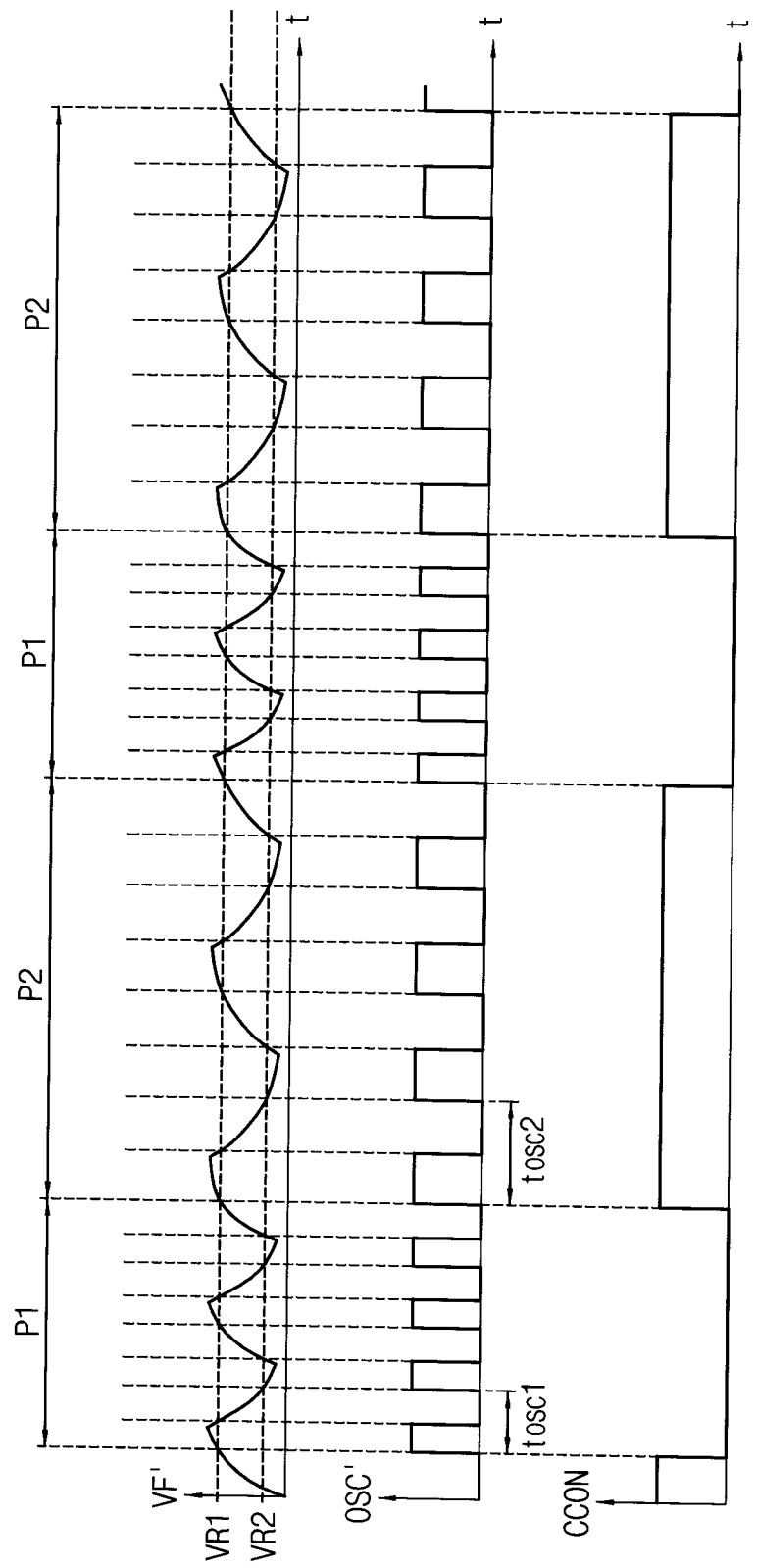
FIG. 11 is a timing diagram illustrating the operation of the temperature controlled oscillator of FIG. 10.

FIG. 11 is a timing diagram illustrating the operation of the temperature controlled oscillator of FIG. 10.

Referring to FIGS. 10 and 11, since the increasing/decreasing operations of the filter voltage VF' according to the charging/discharging operations of the capacitor C and the activating/deactivating operations of the oscillation signal OSC' according to the increasing/decreasing operations of the filter voltage VF' are substantially identical to operations described with reference to FIG. 3, the details thereof will be omitted in order to avoid redundancy.

The correction control signal CCON has a logic low level for a first duration P1, and the select block 242a electrically connects the second node N32 with the output terminal of the oscillation unit 220a. In this case, the filter/frequency adjusting unit 240a has the time constant of "$R_T1 \times C$", and the filter voltage VF' is increased/decreased based on the time constant of "$R_T1 \times C$", so that the oscillation signal OSC' has a first period $t_{osc}1$ that is relatively short.

After first oscillation pulses having the first period $t_{osc}1$ have been generated by a preset number (for example, 4 pulses in FIG. 11), the correction control signal CCON transits from the logic low level to a logic high level. The correction control signal CCON has the logic high level for a second duration P2, and the select block 242a electrically connects the third node N33 with the output terminal of the oscillation unit 220a. In this case, the filter/frequency adjusting unit 240a has the time constant of "$(R_T1+R_T2) \times C$", and the filter voltage VF' is increased/decreased based on the time constant of "$(R_T1+R_T2) \times C$". As the time constant is increased, the oscillation signal OSC' has a second period $t_{osc2}$ longer than the first period $t_{osc}1$.

After second oscillation pulses having the second period $t_{osc}2$ have been generated by a preset number, the correction control signal CCON transits from the logic high level to the logic low level, and the first duration P1 re-starts. Accordingly, the first duration P1 and the second duration P2 may be alternately repeated, and the number of the first oscillation pulses for the first duration P1 may be substantially equal to the number of the second oscillation pulses for the second duration P2.

According to one embodiment, the first and second periods $t_{osc}1$ and $t_{osc}2$ of the oscillation signal OSC' may be determined depending on the resistance values of the first and second on-chip metal resistors $R_T1$ and $R_T2$. For example, the first and second on-chip metal resistors $R_T1$ and $R_T2$ may have the same resistance value, and the same resistance value may be about ½ of the resistance value of the on-chip metal resistor $R_T$ of FIG. 2. In this case, the time constant of the filter/frequency adjusting unit 240a for the first duration P1 is about ½ of the time constant of the filter unit 140a of FIG. 2, and the first period $t_{osc}1$ may be about ½ of the period $t_{osc}$ of the oscillation signal OSC of FIG. 3. For the second duration P2, the time constant of the filter/frequency adjusting unit 240a is substantially equal to the time constant of the filter unit 140a of FIG. 2, and the second period $t_{osc}2$ may be substantially equal to the period $t_{osc}$ of the oscillation signal OSC of FIG. 3.

As described above, if the periods of the oscillation signal OSC' are alternately/repeatedly changed whenever the pulses of the oscillation signal OSC' are generated by a preset number, a digital signal processing circuit provided at the rear stage of the temperature controlled oscillator 200a properly processes the oscillation signal OSC', thereby removing offset errors from the oscillation signal OSC'. The detailed configuration and the detailed method of removing the offset errors will be described later with reference to FIGS. 22 and 23.

Figure 12:
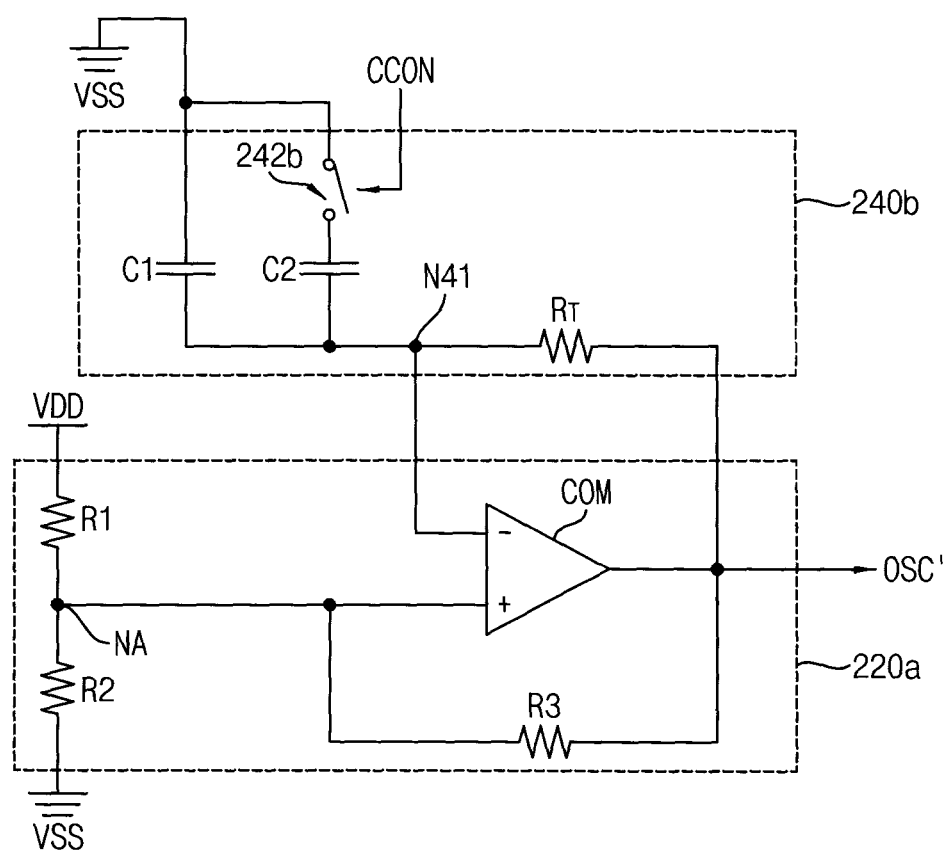
FIG. 12 is a circuit diagram illustrating another example of the temperature controlled oscillator of FIG. 9.

FIG. 12 is a circuit diagram illustrating another example of the temperature controlled oscillator of FIG. 9.

Referring to FIG. 12, a temperature controlled oscillator 200b includes an oscillation unit 220a and a filter/frequency adjusting unit 240b.

The temperature controlled oscillator 200b of FIG. 12 may be substantially identical to the temperature controlled oscillator 200a of FIG. 10 except that the filter/frequency adjusting unit 240b has a modified configuration.

The filter/frequency adjusting unit 240b may include an on-chip metal resistor $R_T$, a first capacitor C1, a second capacitor C2, and a select block 242b. The on-chip metal resistor $R_T$ has a first terminal connected with a first node N41, and a second terminal connected with an output terminal (i.e., an output terminal of a comparator COM) of the oscillation unit 220a. The on-chip metal resistor $R_T$ may have a resistance value linearly varying according to time variation. The first capacitor C1 has a first terminal connected with the first node N41, and a second terminal connected with the terminal of ground voltage VSS. The capacitor C1 may be charged or discharged based on an oscillation signal OSC' to supply filter voltage VF'. The second capacitor C2 has a first terminal connected with the first node N41. The select block 242b may selectively and electrically connect the second terminal of the first capacitor C1 with the second terminal of the second capacitor C2 in response to a correction control signal CCON. For example, the select block 242b may include a switch. The voltage at the first node N41 may serve as the filter voltage VF'.

The temperature controlled oscillator 200b of FIG. 12 may operate as illustrated in FIG. 11. In this case, the select block 242b for the first duration P1 does not electrically connect the second terminal of the first capacitor C1 with the second terminal of the second capacitor C2, and the filter/frequency adjusting unit 240b has the time constant of "$R_T \times C1$". The oscillation signal OSC' has the first period $t_{osc}1$ based on the time constant of "$R_T \times C1$". The select block 242b for the second duration P2 electrically connects the second terminal of the first capacitor C1 with the second terminal of the second capacitor C2, and the filter/frequency adjusting unit 240b has the time constant of "$R_T \times (C1+C2)$". The oscillation signal OSC' has the second period $t_{osc}2$ based on the time constant of "$R_T \times (C1+C2)$".

According to one embodiment, the first and second periods $t_{osc}1$ and $t_{osc}2$ of the oscillation signal OSC' may be determined depending on the capacitance of the first capacitor C1 and the capacitance of the second capacitor C2. For example, the first and second capacitors C1 and C2 may have the same capacitance, and the same capacitance may be about ½ of the capacitance of the capacitor C of FIG. 2. In this case, the time constant of the filter/frequency adjusting unit 240b for the first duration P1 is about ½ of the time constant of the filter unit 140a of FIG. 2, and the first period $t_{osc}1$ may be about ½ of the period $t_{osc}$ of the oscillation signal OSC of FIG. 3. For the second duration P2, the time constant of the filter/frequency adjusting unit 240b is substantially equal to the time constant of the filter unit 140a of FIG. 2, and the second period $t_{osc}2$ may be substantially equal to the period $t_{osc}$ of the oscillation signal OSC of FIG. 3.

Figure 13:
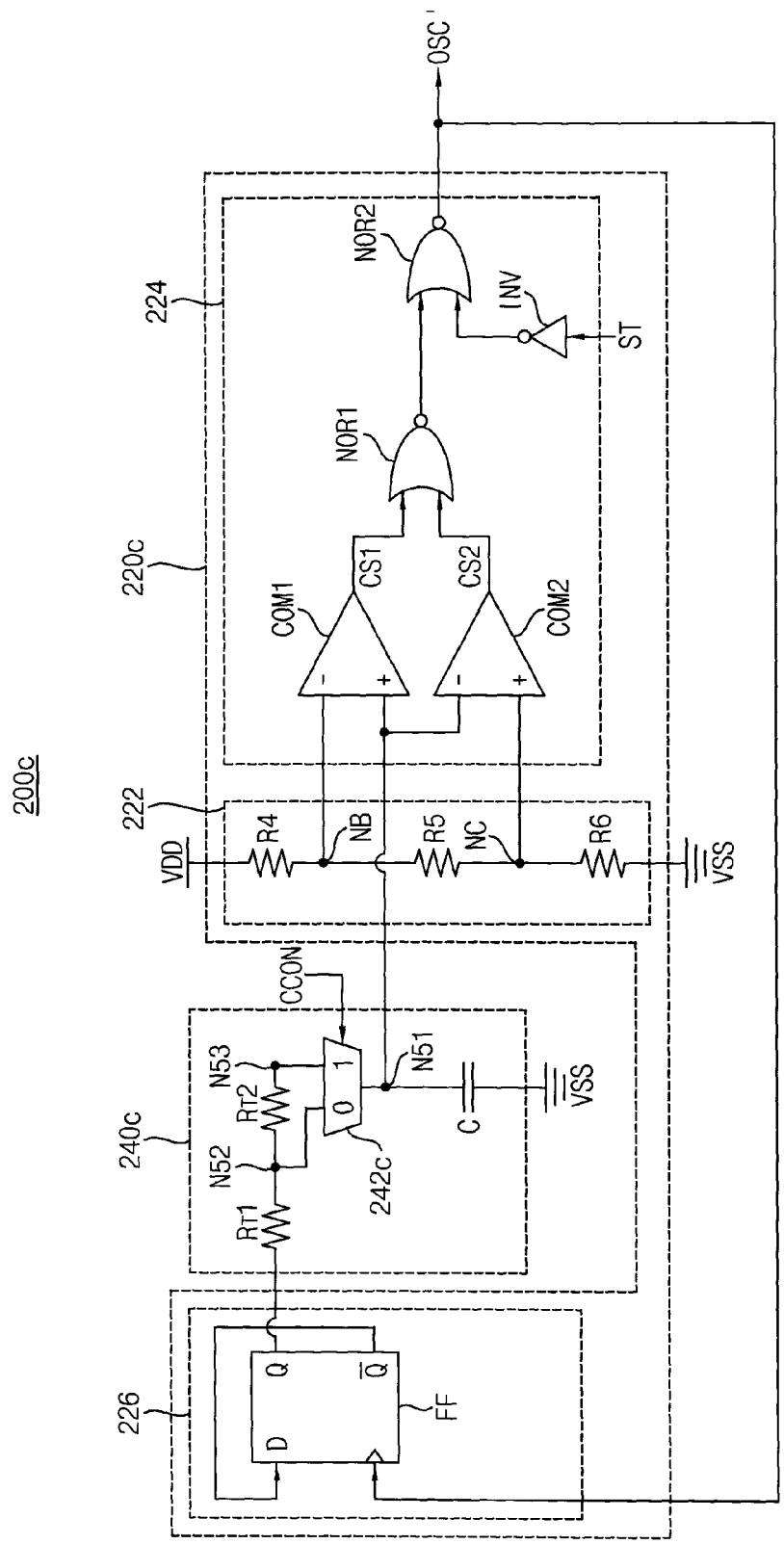
FIG. 13 is a circuit diagram illustrating still another example of the temperature controlled oscillator of FIG. 9.

FIG. 13 is a circuit diagram illustrating still another example of the temperature controlled oscillator of FIG. 9.

Referring to FIG. 13, a temperature controlled oscillator 200c includes an oscillation unit 220c and a filter/frequency adjusting unit 240c.

The filter/frequency adjusting unit 240c may include a first on-chip metal resistor $R_T1$, a second on-chip metal resistor $R_T2$, a select block 242c, and a capacitor C. The on-chip metal resistor $R_T1$ has a first terminal connected with a second node N52, and a second terminal connected with an output terminal of a latch block 226. The second on-chip metal resistor $R_T2$ may be connected between the second node N52 and a third node N53. The first on-chip metal resistor $R_T1$ and the second on-chip metal resistor $R_T2$ may have resistance values linearly varying according to temperature variation. The select block 242c may electrically connect one of the second node N52 and the third node N53 with the first node N51 in response to a correction control signal CCON. The capacitor has a first terminal connected with the first node N51, and a second terminal connected with the terminal of ground voltage VSS. The capacitor C is charged or discharged based on an oscillation signal OSC' and the correction control signal CCON to supply filter voltage VF'. The voltage at the first node N51 may serve as the filter voltage VF'.

The oscillation unit 220c may be substantially identical to the oscillation unit 120c included in the temperature controlled oscillator 100c of FIG. 5. In other words, the oscillation unit 220c may include a reference voltage generation block 222, an output block 224, and a latch block 226. The reference voltage generation block 222 may include a first resistor R4, a second resistor R5, and a third resistor R6. The output block 224 may include a first comparator COM1, a second comparator COM2, a first NOR gate NOR1, an inverter INV, and a second NOR gate NOR2. The latch block 226 may include a flip-flop FF.

Figure 14:
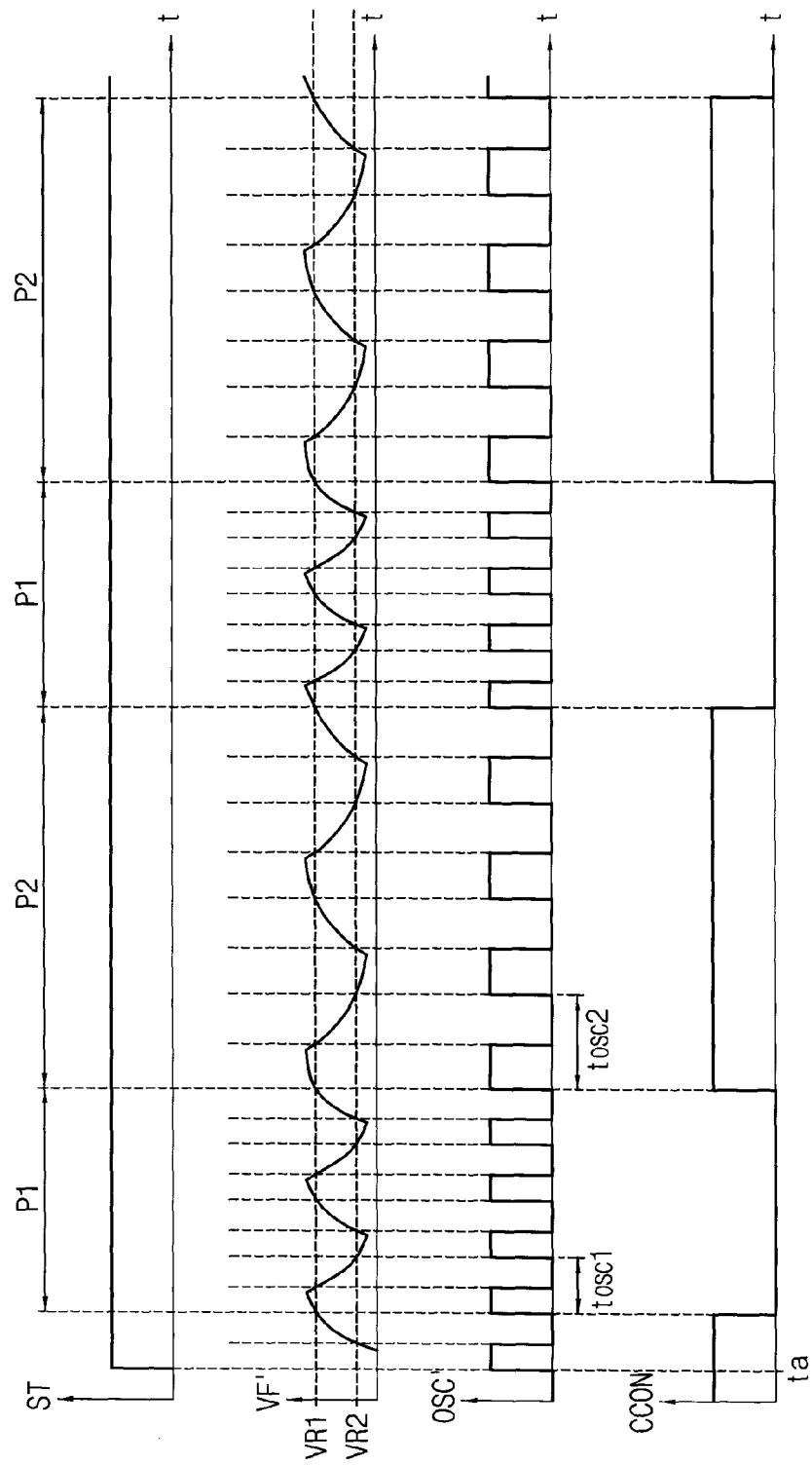
FIG. 14 is a timing diagram illustrating the operation of the temperature controlled oscillator of FIG. 13.

FIG. 14 is a timing diagram illustrating the operation of the temperature controlled oscillator of FIG. 13.

Referring to FIGS. 13 and 14, the increasing/decreasing operations of the filter voltage VF' according to the charging/discharging operations of the capacitor C and the activating/deactivating operations of the oscillation signal OSC' according to the increasing/decreasing operations of the filter voltage VF' are substantially identical to operations described with reference to FIG. 6.

At time ta, a start signal ST is activated, so that the temperature controlled oscillator 200c starts to be driven. Accordingly, the oscillation signal OSC' is activated.

The correction control signal CCON has a logic low level for a first duration P1, and the select block 242c electrically connects the second node N52 with the first node N51. In this case, the oscillation signal OSC' has the first period $t_{osc}1$ based on "$R_T1 \times C$" which is the time constant of the filter/frequency adjusting unit 240c.

The correction control signal CCON has a logic high level for a second duration P2, and the select block 242c electrically connects the third node N53 with the first node N51. In this case, the oscillation signal OSC' has the second period $t_{osc}2$ based on "$(R_T1+R_{T2}) \times C$" which is the time constant of the filter/frequency adjusting unit 240c. The first duration P1 and the second duration P2 may be alternately repeated, and the number of first oscillation pulses for the first duration P1 may be substantially equal to the number of second oscillation pulses for the second duration P2.

According to one embodiment, the first and second periods $t_{osc}1$ and $t_{osc}2$ of the oscillation signal OSC' may be determined depending on the resistance values of the first and second on-chip metal resistors $R_T1$ and $R_T2$. For example, the first and second on-chip metal resistors $R_T1$ and $R_T2$ may have the same resistance value, and the same resistance value may be about ½ of the resistance value of the on-chip metal resistor $R_T$ of FIG. 2. In this case, the first period $t_{osc}1$ may be about ½ of the period $t_{osc}$ of the oscillation signal OSC of FIG. 6, and the second period $t_{osc}2$ may be substantially equal to the period $t_{osc}$ of the oscillation signal OSC of FIG. 6.

Figure 15:
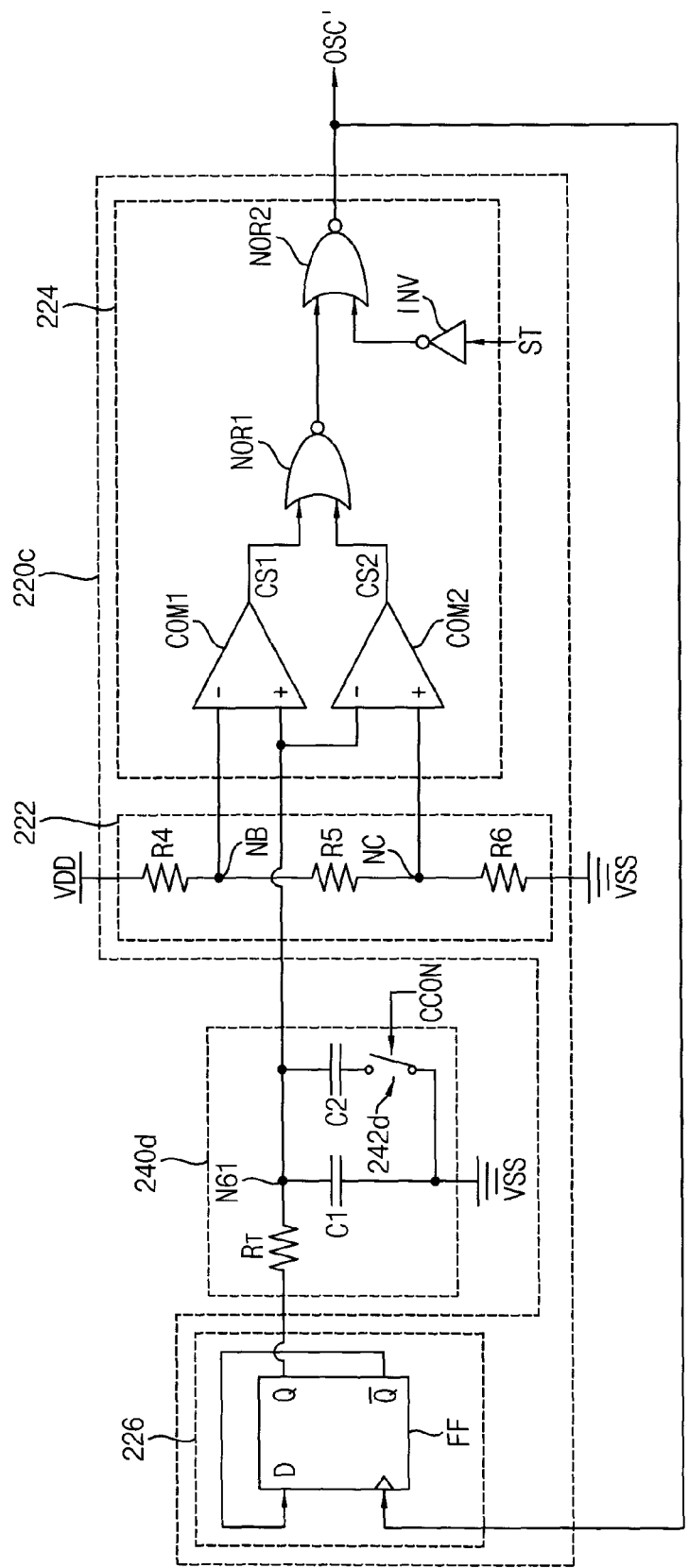
FIG. 15 is a circuit diagram illustrating still yet another example of the temperature controlled oscillator of FIG. 9.

FIG. 15 is a circuit diagram illustrating still yet another example of the temperature controlled oscillator of FIG. 9.

Referring to FIG. 15, a temperature controlled oscillator 200d includes an oscillation unit 220c and a filter/frequency adjusting unit 240d.

The temperature controlled oscillator 200d of FIG. 15 is substantially identical to the temperature controlled oscillator 200c of FIG. 13 except that the filter/frequency adjusting unit 240 has a modified configuration.

The filter/frequency adjusting unit 240d may include an on-chip metal resistor $R_T$, a first capacitor C1, a second capacitor C2, and a select block 242d. The on-chip metal resistor $R_T$ has a first terminal connected with a first node N61, and a second terminal connected with an output terminal of a latch block 226. The on-chip metal resistor $R_T$ may have a resistance value linearly varying according to time variation. The first capacitor C1 has a first terminal connected with the first node N61, and a second terminal connected with the terminal of ground voltage VSS. The capacitor C1 may be charged or discharged based on an oscillation signal OSC' to supply filter voltage VF'. The second capacitor C2 has a first terminal connected with the first node N61. The select block 242d may selectively and electrically connect the second terminal of the first capacitor C1 with the second terminal of the second capacitor C2 in response to a correction control signal CCON. The voltage at the first node N61 may serve as the filter voltage VF'.

The temperature controlled oscillator 200d of FIG. 15 may operate as illustrated in FIG. 14. In this case, the select block 242d for the first duration P1 does not electrically connect the second terminal of the first capacitor C1 with the second terminal of the second capacitor C2, and the oscillation signal OSC' has the first period $t_{osc}1$ based on the time constant of "$R_T \times C1$". The select block 242d for the second duration P2 electrically connects the second terminal of the first capacitor C1 with the second terminal of the second capacitor C2, and the oscillation signal OSC' has the second period $t_{osc}2$ based on the time constant of "$R_T \times (C1+C2)$" of the filter/frequency adjusting unit 240d.

According to one embodiment, the first and second periods $t_{osc}1$ and $t_{osc}2$ of the oscillation signal OSC' may be determined depending on the capacitance of the first capacitor C1 and the capacitance of the second capacitor C2. For example, the first and second capacitors C1 and C2 may have the same capacitance, and the same capacitance may be about ½ of the capacitance of the capacitor C of FIG. 5. In this case, the first period $t_{osc}1$ may be about ½ of the period $t_{osc}$ of the oscillation signal OSC of FIG. 6, and the second period $t_{osc}2$ may be substantially equal to the period $t_{osc}$ of the oscillation signal OSC of FIG. 6.

Although not illustrated in drawings, the capacitors C, C1, and C2 included in the temperature controlled oscillators 200a, 200b, and 200c may be implemented in the form of the Miller capacitor as illustrated in FIGS. 4 and 8 according to example embodiments, and the latch block 226 included in the temperature controlled oscillators 220c and 200d may be implemented to include a latch such as an S-R latch instead of the flip-flop FF.

Figure 16:
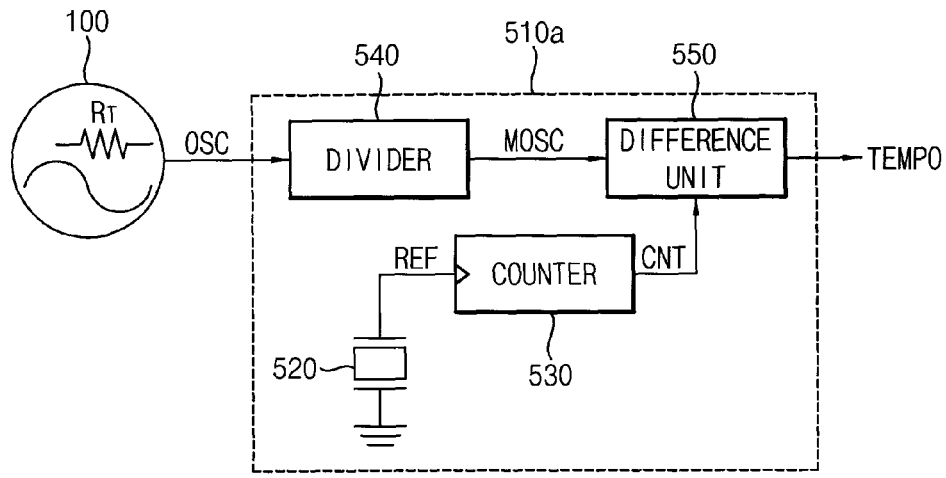
FIG. 16 is a block diagram illustrating a temperature sensor according to at least one example embodiment.

FIG. 16 is a block diagram illustrating a temperature sensor according to example embodiments.

Referring to FIG. 16, a temperature sensor 500a includes a temperature controlled oscillator 100 and an analogue-digital (A/D) conversion circuit 510a.

The temperature controlled oscillator 100 detects a present temperature to generate an oscillation signal OSC. The oscillation signal OSC has a period varying depending on temperature variation. The temperature controlled oscillator 100 may be the temperature controlled oscillator 100 of FIG. 1, and may be implemented in the configuration illustrated in FIG. 2, 4, 5, 7 or 8. In other words, the temperature controlled oscillator 100 includes an oscillation unit 120 and a filter unit 140, and the filter unit 140 includes an on-chip metal resistor $R_T$ and a capacitor C. The temperature controlled oscillator 100 includes the on-chip metal resistor $R_T$, so that the temperature controlled oscillator 100 can accurately and effectively generate the oscillation signal OSC having a period proportional to the temperature. In addition, the temperature controlled oscillator 100 has the smaller and simpler configuration, and can be implemented at the lower manufacturing cost.

The A/D converting circuit 510a generates a digital output signal TEMP based on both of the oscillation signal OSC and a reference oscillation signal REF. The digital output signal TEMPO corresponds to the present temperature. The A/D conversion circuit 510a may include a local oscillator 520, a counter 530, a divider 540, and a difference unit 550.

The local oscillator 520 may generate the reference oscillation signal REF. For example, the local oscillator 520 may include a crystal oscillator.

The counter 530 may generate a count signal CNT based on the reference oscillation signal REF. For example, the count signal CNT may be sequentially increased at every rising edge or every falling edge of the reference oscillation signal REF. The count signal CNT generated from the counter 530 is not reset, but consecutively increased. In this case, the counter 530 may be implemented through a 2's complement scheme.

The divider 540 may divide the oscillation signal OSC to generate a division signal MOSC. According to example embodiments, the division ratio of the divider 540 may be variously changed.

The difference unit 550 may generate the digital output signal TEMPO based on the division signal MOSC and the count signal CNT. For example, the difference unit 550 obtains a count value of the count signal CNT at every rising edge or every falling edge of the division signal MOSC to generate the digital output signal TEMPO. For example, the difference unit 550 may have a transfer function of "$1-z^{-1}$"

Figure 17:
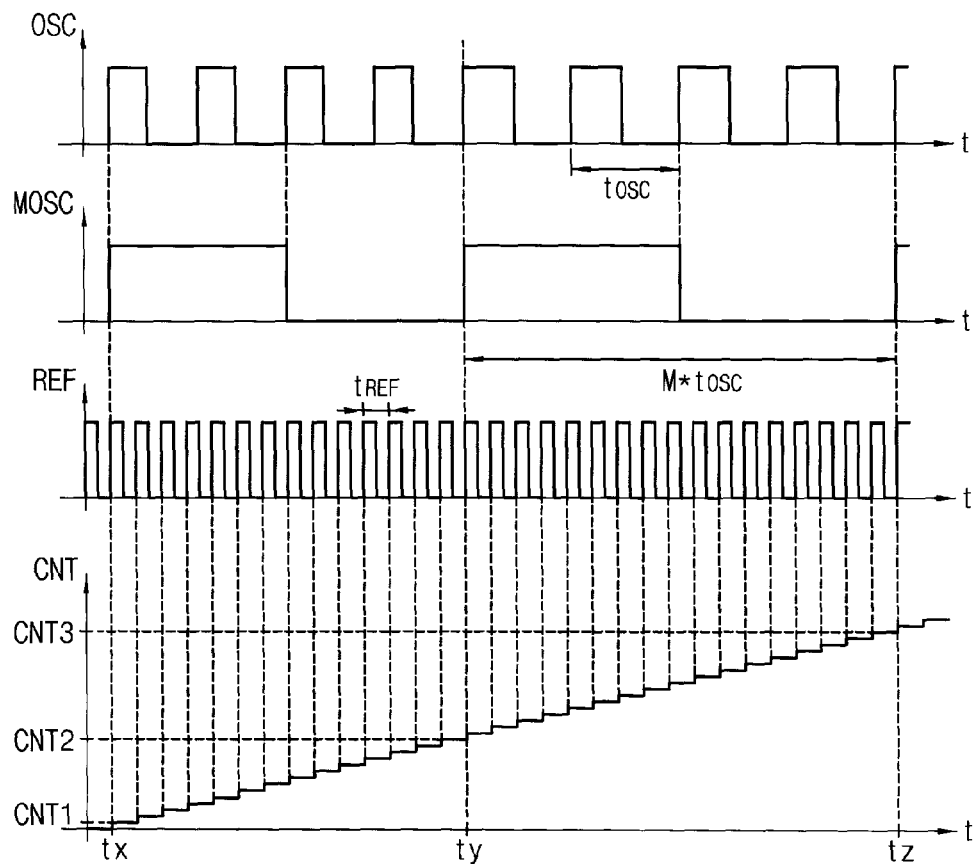
FIG. 17 is a timing diagram illustrating the operation of the temperature sensor of FIG. 16.

FIG. 17 is a timing diagram illustrating the operation of the temperature sensor of FIG. 16.

Referring to FIGS. 16 and 17, the local oscillator 520 generates the reference oscillation signal REF having a fixed reference period $t_{REF}$, and the counter 530 generates the count signal CNT increased at every rising edge of the reference oscillation signal REF. The temperature controlled oscillator 100 generates the oscillation signal OSC having a period $t_{osc}$ varying depending on temperature variation, and the divider 540 divides the oscillation signal OSC by M to generate the division signal MOSC having a period of $M \times t_{osc}$. In this case, M is a natural number equal to or greater than 2, and may be 4 in FIG. 17.

The difference unit 550 obtains a count value of the count signal CNT at every rising edge of the division signal MOSC, subtracts a previous count value obtained at a previous edge of the division signal MOSC from a present count value obtained at a present edge of the division signal MOSC, and generates the digital output signal TEMPO. For example, the difference unit 550 obtains a first count value CNT1 at time tx, obtains a second count value CNT2 at time ty, and obtains a third count value CNT3 at time tz. The difference unit 550 subtracts the first count value CNT1 from the second count value CNT2 to generate a first temperature value, subtracts the second count value CNT2 from the third count value CNT3 to generate a second temperature value, and outputs each of the first and second temperature values as the digital output signal TEMPO. Since the period $t_{osc}$ of the oscillation signal OSC is increased, that is, the second temperature value is greater than the first temperature value, FIG. 17 may illustrate an example that the temperature is increased by the lapse of time.

According to example embodiments, the resolution of the temperature sensor 500a may be determined depending on the resistance value of the on-chip metal resistor $R_T$ and the capacitance of the capacitor C, which constitute the temperature controlled oscillator 100, the division ratio (M) of the divider 540, and the period $t_{REF}$ of the reference oscillation signal REF. In addition, if the resistance value of the on-chip metal resistor $R_T$ has the sufficiently linear characteristic with respect to the temperature variation, and the delay time $t_L$, caused by the parasitic delay is short sufficiently to satisfy Equation 2, the reliability of the temperature sensor 500a can be ensured. For example, if the variation in the period of the division signal MOSC is 2n greater than the variation in the period $t_{REF}$ of the reference oscillation signal REF, and the distortion of the period of the division signal MOSC caused by the delay time t1 is less than the distortion of the period $t_{REF}$ of the reference oscillation signal REF in a specific temperature range, the n-bit resolution temperature sensor having the reliability ensured in the specific temperature range can be designed.

Figure 18:
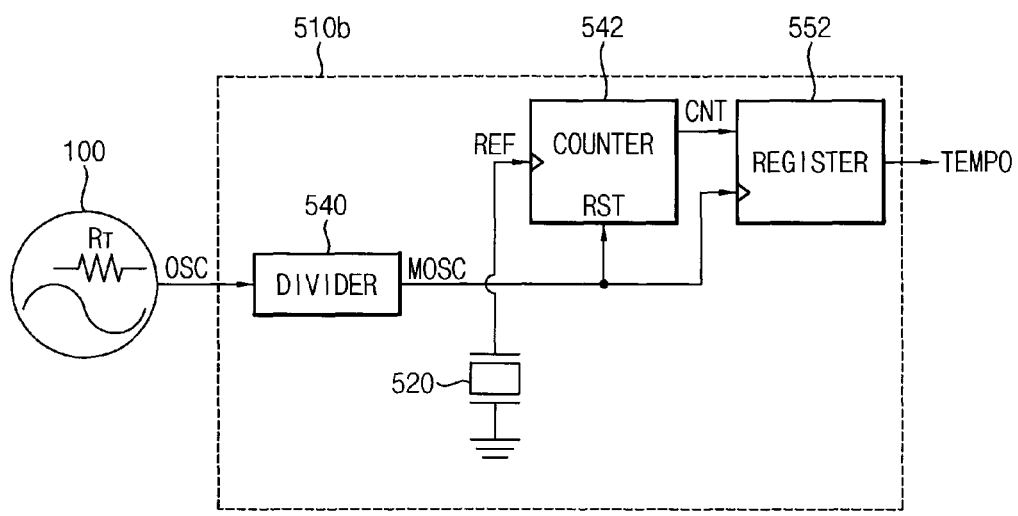
FIG. 18 is a block diagram illustrating a temperature sensor according to at least one example embodiment.

FIG. 18 is a block diagram illustrating a temperature sensor according to example embodiments.

Referring to FIG. 18, a temperature sensor 500b includes a temperature controlled oscillator 100 and an A/D conversion circuit 510b.

The temperature sensor 500b of FIG. 18 may be substantially identical to the temperature sensor 500a of FIG. 16 except that the A/D conversion circuit 510b has a modified configuration.

The A/D conversion circuit 510b may include a local oscillator 520, a divider 540, a counter 542, and a register 552.

The local oscillator 520 may generate a reference oscillation signal REF. The divider 540 may divide the oscillation signal OSC to generate a division signal MOSC.

The counter 542 may generate a count signal CNT based on the reference oscillation signal REF and the division signal MOSC. For example, the count signal CNT may be sequentially increased at every rising edge or every falling edge of the reference oscillation signal REF, and may be reset at every rising edge or every falling edge of the division signal MOSC.

The register 552 may generate a digital output signal TEMPO based on the division signal MOSC and the count signal CNT. For example, the register 552 obtains a count value at every rising edge or every falling edge of the division signal MOSC to generate the digital output signal TEMPO.

Figure 19:
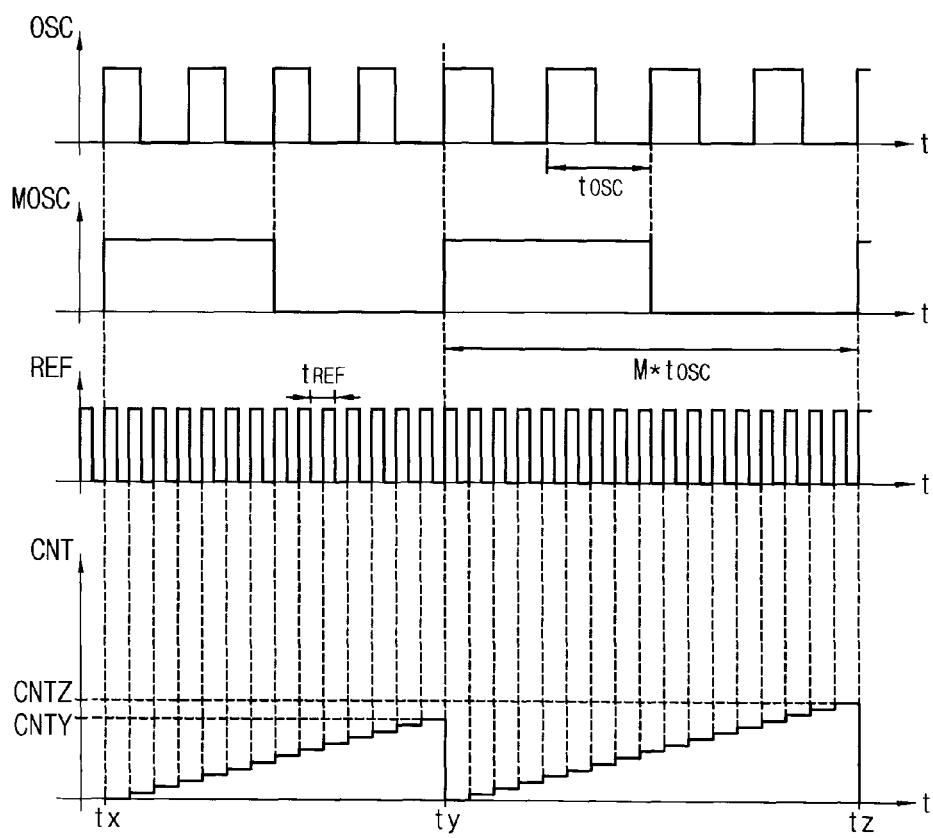
FIG. 19 is a timing diagram illustrating the operation of the temperature sensor of FIG. 18.

FIG. 19 is a timing diagram illustrating the operation of the temperature sensor of FIG. 18.

Referring to FIGS. 18 and 19, a temperature controlled oscillator 100 generates an oscillation signal OSC having a period $t_{osc}$ varying depending on temperature variation, and the divider 540, and the divider 540 divides the oscillation signal OSC by M to generate the division signal MOSC having a period of $M \times t_{osc}$. The local oscillator 520 generates the reference oscillation signal REF having a fixed reference period $t_{REF}$, and the counter 542 generates the count signal CNT increased at every rising edge of the reference oscillation signal REF and reset at every rising edge of the division signal MOSC.

The register 552 obtains a count value of the count signal CNT at every rising edge of the division signal MOSC. For example, the register 552 obtains a first count value CNTY at time ty, and obtains a second count value CNTZ at time tz. Since the count signal CNT is reset at every rising edge of the division signal MOSC, the register 552 outputs each of the first and second count values CNTY and CNTZ as the digital output signal TEMPO. Since the period $t_{osc}$ of the oscillation signal OSC is increased, that is, the second count value CNTZ is greater than the first count value CNTY, FIG. 19 may illustrate an example that the temperature is increased by the lapse of time.

Figure 20:
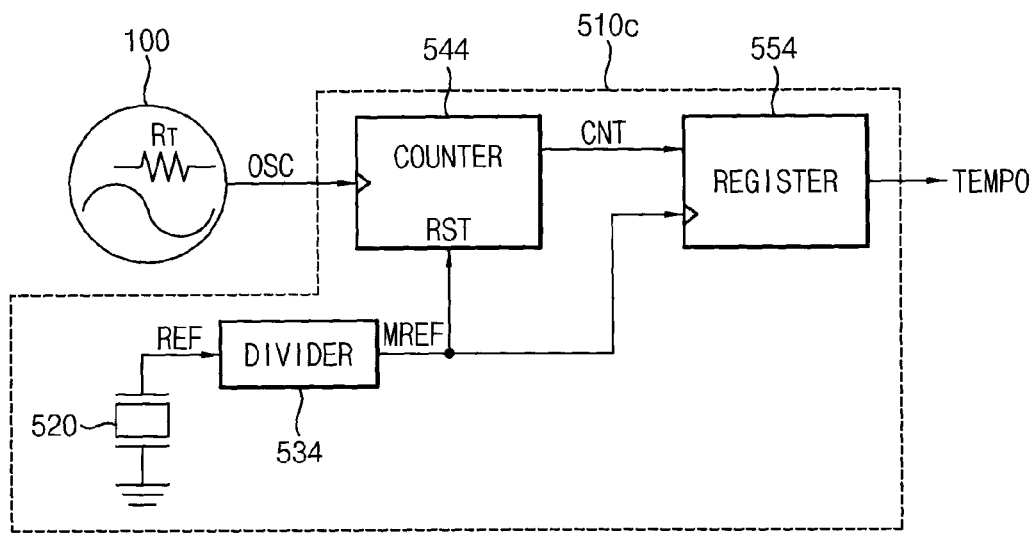
FIG. 20 is a block diagram illustrating a temperature sensor according to at least one example embodiment.

FIG. 20 is a block diagram illustrating a temperature sensor according to example embodiments.

Referring to FIG. 20, a temperature sensor 500c includes a temperature controlled oscillator 100 and an A/D conversion circuit 510c.

The temperature sensor 500c of FIG. 20 may be substantially identical to the temperature sensor 500a of FIG. 16 except that the A/D conversion circuit 510c has a modified configuration.

The A/D conversion circuit 510c may include a local oscillator 520, a divider 534, a counter 544, and a register 554.

The local oscillator 520 may generate a reference oscillation signal REF. The divider 534 may divide the oscillation signal OSC to generate a division signal MREF.

The counter 544 may generate a count signal CNT based on the oscillation signal OSC and the division signal MREF. For example, the count signal CNT may be sequentially increased at every rising edge or every falling edge of the oscillation signal OSC, and may be reset at every rising edge or every falling edge of the division signal MREF.

The register 554 may generate a digital output signal TEMPO based on the division signal MREF and the count signal CNT. For example, the register 554 obtains a count value at every rising edge or every falling edge of the division signal MREF to generate the digital output signal TEMPO.

Figure 21:
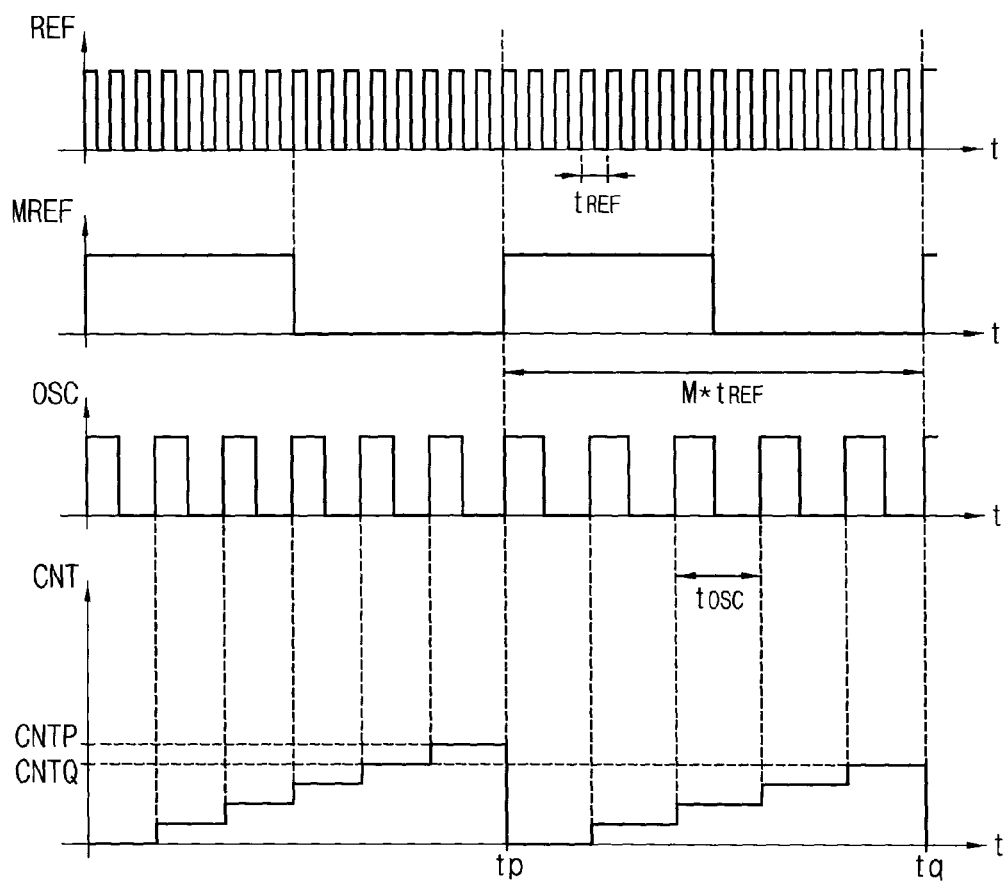
FIG. 21 is a waveform illustrating the operation of the temperature sensor of FIG. 20.

FIG. 21 is a waveform illustrating the operation of the temperature sensor of FIG. 20.

Referring to FIGS. 20 and 21, the local oscillator 520 generates the reference oscillation signal REF having a fixed reference period $t_{REF}$, and the divider 534 divides the reference oscillation signal REF by M to generate the division signal MREF having a period of $M \times t_{REF}$. The temperature controlled oscillator 100 generates the oscillation signal OSC having a period $t_{osc}$ varying depending on temperature variation, and the counter 544 generates a count signal CNT increased at ever rising edge of the reference oscillation signal REF and reset at ever rising edge of the division signal MREF.

The register 554 obtains a count value of the count signal CNT at every rising edge of the division signal MREF. For example, the register 554 obtains a first count value CNTP at time tp, and obtains a second count value CNTQ at time tq. Since the count signal CNT is reset at every rising edge of the division signal MREF, the register 554 outputs each of the first and second count values CNTP and CNTQ as the digital output signal TEMPO. Since the period $t_{osc}$ of the oscillation signal OSC is decreased, that is, the second count value CNTQ is less than the first count value CNTP, FIG. 21 may illustrate an example that the temperature is decreased by the lapse of time.

The temperature sensors 500a, 500b, and 500c include the temperature controlled oscillator 100 having the on-chip metal resistor $R_T$, so that the temperature sensors 500a, 500b, and 500c can accurately and effectively generate the digital output signal TEMPO having a period proportional to the temperature. In addition, the temperature sensors 500a, 500b, and 500c can have the smaller and simpler configuration, and can be implemented at the lower manufacturing cost.

Figure 22:
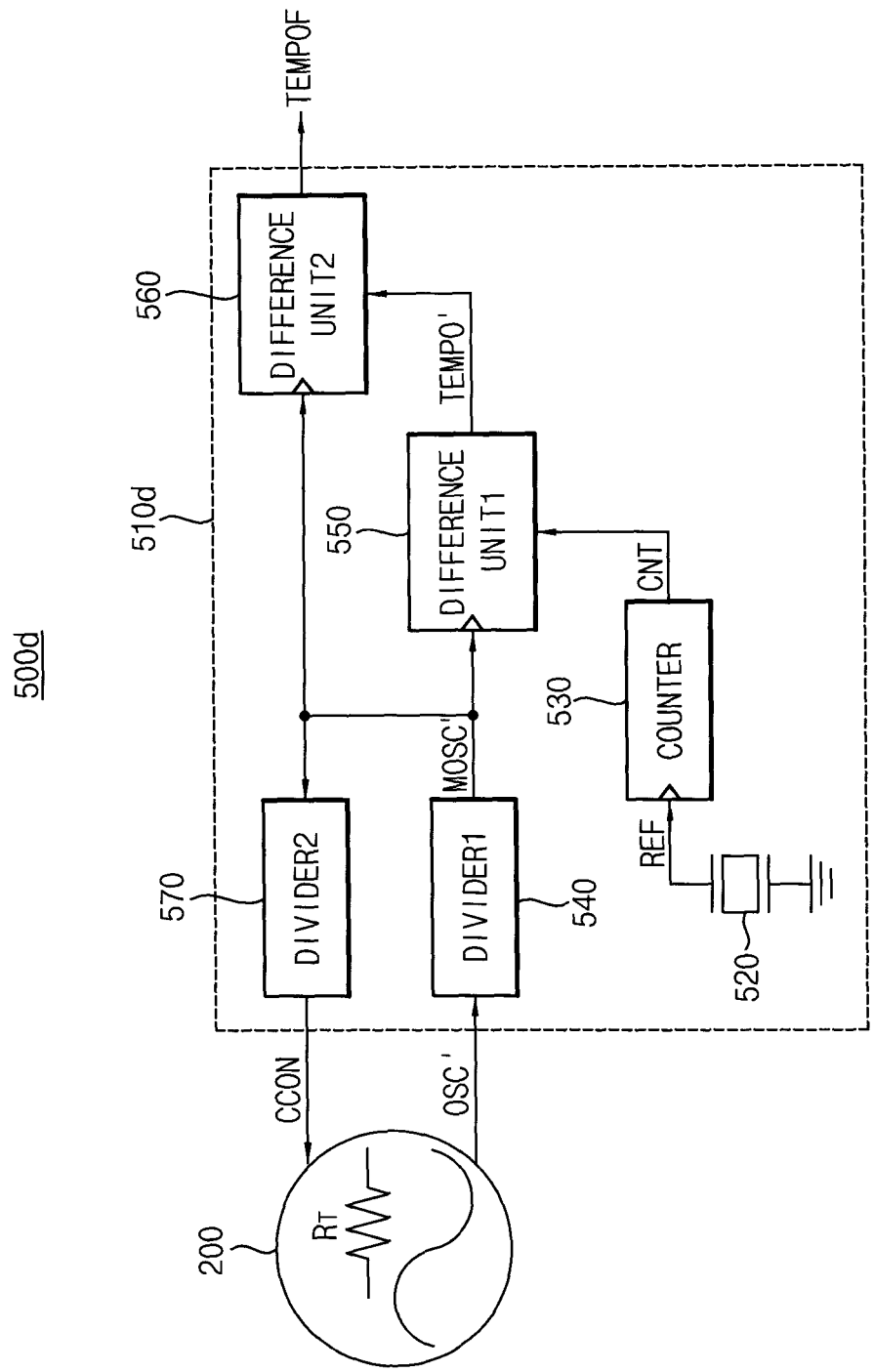
FIG. 22 is a block diagram illustrating a temperature sensor according to at least one example embodiment.

FIG. 22 is a block diagram illustrating a temperature sensor according to example embodiments.

Referring to FIG. 22, a temperature sensor 500d includes a temperature controlled oscillator 200 and an A/D conversion circuit 510d.

The temperature controlled oscillator 200 detects a present temperature to generate an oscillation signal OSC'. The oscillation signal OSC' has a period varying depending on temperature variation. In order to remove offset errors from the oscillation signal OSC', the temperature controlled oscillator 200 adjusts the period of the oscillation signal OSC' based on a correction control signal CCON. The temperature controlled oscillator 200 may include the temperature controlled oscillator 200 of FIG. 9, and may be implemented in the configurations illustrated in FIGS. 10, 12, 13, and 15. In other words, the temperature controlled oscillator 200 includes an oscillation unit 220 and a filter/frequency adjusting unit 240 including an on-chip metal resistor $R_T$. The temperature controlled oscillator 200 includes the on-chip metal resistor $R_T$, so that the temperature controlled oscillator 200 can accurately and effectively generate the oscillation signal OSC' having a period proportional to the temperature. In addition, the temperature controlled oscillator 200 has the smaller and simpler configuration, and can be implemented at the lower manufacturing cost. In addition, in order to remove offset errors included in the oscillation signal OSC' due to the parasitic delay of the oscillation unit 220, the temperature controlled oscillator 200 adjusts the period of the oscillation signal OSC' based on a correction control signal CCON.

The A/D converting circuit 510d generates a first digital output signal TEMPOF and a correction control signal CCON based on both of the oscillation signal OSC' and a reference oscillation signal REF. The first digital output signal TEMPOF is a signal corresponding to a present temperature and obtained by correcting the offset errors. The A/D conversion circuit 510d may include a local oscillator 520, a counter 530, a first divider 540, a first difference unit 550, a second difference unit 560, and a second divider 570.

The local oscillator 520, the counter 530, the first divider 540, and the first difference unit 550 may be substantially identical to the local oscillator 520, the counter 530, the divider 540, and the difference unit 550 constituting the temperature sensor 500a of FIG. 16, respectively. In other words, the local oscillator 520 may generate a reference oscillation signal REF, the counter 530 may generate a count signal CNT based on the reference oscillation signal REF, the first divider 540 may generate a division signal MOSC' obtained by dividing the oscillation signal OSC', and the first difference unit 550 may obtain a count value of the count signal CNT at every rising edge or every falling edge of the division signal MOSC' to generate a second digital output signal TEMPO'.

The second difference unit 560 may generate the first digital output signal TEMPOF based on the division signal MOSC' and the second digital output signal TEMPO'. For example, the second difference unit 560 may obtain the value of the second digital output signal TEMPO' at every rising edge or every falling edge of the division signal MOSC' to generate the first digital output signal TEMPOF. For example, the second difference unit 560 may have a transfer function of "$1-z^{-1}$"

The second divider 570 may divide the division signal MOSC' to generate the correction control signal CCON. For example, the second divider 570 may generate the correction control signal CCON by dividing the division signal MOSC' by 2.

Figure 23:
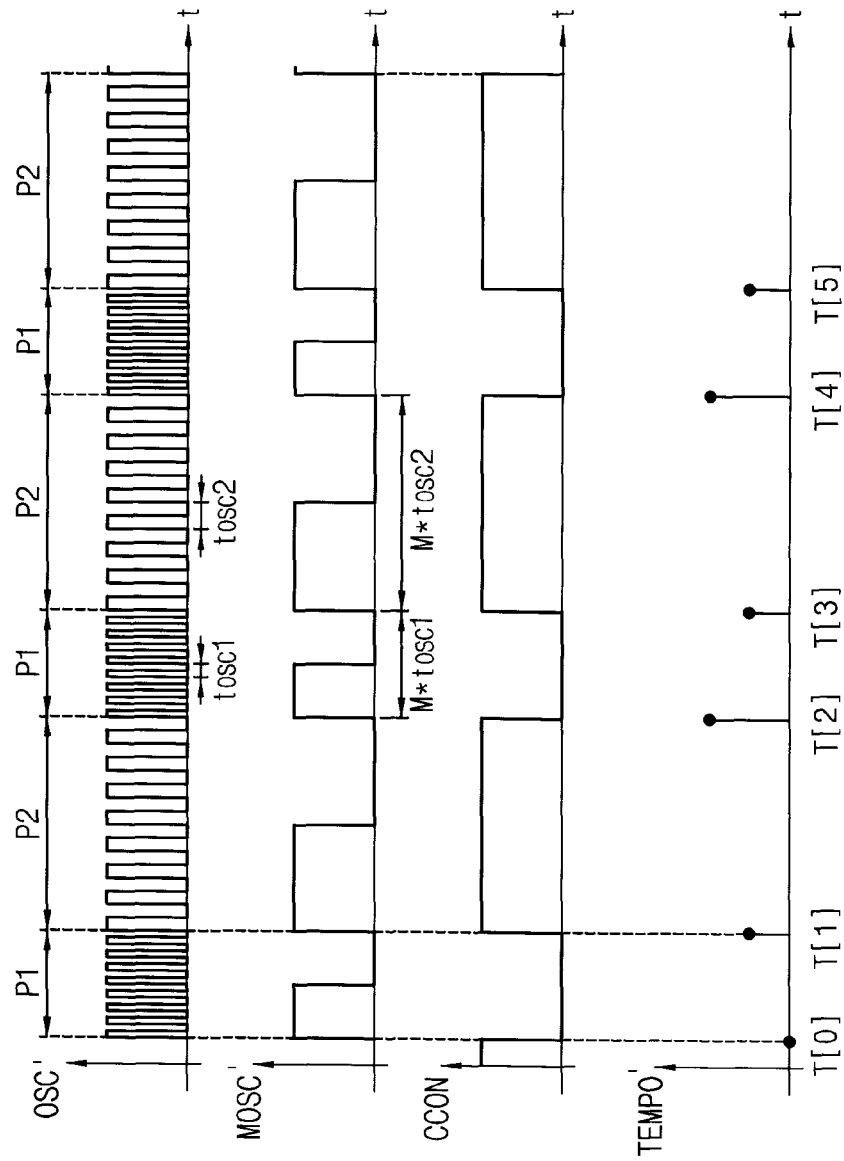
FIG. 23 is a waveform illustrating the operation of the temperature sensor of FIG. 22.

FIG. 23 is a waveform illustrating the operation of the temperature sensor of FIG. 22.

Referring to FIGS. 22 and 23, since the operation of generating the second digital output signal TEMPO' based on the oscillation signal OSC' and the reference oscillation signal (REF) is substantially identical to that described with reference to FIG. 17, the details thereof will be omitted in order to avoid redundancy.

The second divider 570 generates the correction control signal CCON by dividing the division signal MOSC' by 2. For a first duration P1 where the correction control signal CCON has a logic low level, the oscillation signal OSC' has a first period $t_{OSC}1$ which is shorter. For a second duration P2 where the correction control signal CCON has a logic high level, the oscillation signal OSC' has a second period $t_{OSC}2$ higher than the first period $t_{OSC}1$. Accordingly, the division signal MOSC' has a period M* $t_{OSC}1$, which is shorter, for the first duration P1, and has a period M* $t_{OSC}2$, which is longer, for the second duration P2.

The second difference unit 560 obtains the value of the second digital output signal TEMPO' at every rising edge of the division signal MOSC'. The second difference unit 560 may generate the first digital output signal TEMPOF by subtracting a previous value of the second digital output signal TEMPO', which is obtained at a previous edge of the division signal MOSC', from a present value of the second digital output signal TEMPO' obtained at a present edge of the division signal MOSC'.

For example, when the second period $t_{OSC}2$ is twice longer than the first period $t_{OSC}1$ (i.e., $t_{OSC}1=t_{OSC}2/2$), that is, when the temperature controlled oscillator 200 is realized in such a manner that the first and second on-chip metal resistors ($R_T1$ and $R_T2$ of FIGS. 10 and 13) have the same resistance value or the first and second capacitors (C1 and C2 of FIGS. 12 and 15) have the same capacitance, the value T[n] of the second digital output signal TEMPO' output from the first difference unit 550 may be expressed as Equation 5 and Equation 6 as a function of the value of n.

$$T[2n-1]=M(t_{OSC2}/2+t_L)-(q_e[2n-1]-q_e[2n-2]) \quad \text{Equation 5}$$

$$T[2n]=M(t_{OSC2}+t_L)-(q_e[2n]-q_e[2n-1]) \quad \text{Equation 6}$$

In Equation 5 and Equation 6, $t_L$ represents an offset error component caused by parasitic delay. In Equation 5, each of $q_e[2n-1]$ and $q_e[2n-2]$ represent a quantization error resulting from the operation for T[2n-1] in the first difference unit 550. Similarly, in Equation 6, $q_e[2n]$ and $q_e[2n-1]$ represent a quantization error resulting from the operation for T[2n] in the first difference unit 550.

Based on Equation 5 and Equation 6, the value of the first digital output signal TEMPOF output from the second difference unit 560 may be expressed as Equation 7.

$$\begin{aligned} TEMPOF &= T[n] - T[n-1] \\ &= \begin{cases} Mt_{OSC2}/2 - (q_e[n] - 2q_e[n-1] + q_e[n-2]), & \text{when } n \text{ is even} \\ -Mt_{OSC2}/2 - (q_e[n] - 2q_e[2n-1] + q_e[n-2]), & \text{when } n \text{ is odd} \end{cases} \end{aligned} \quad \text{Equation 7}$$

The values of the second digital output signal TEMPO' obtained by Equation 5 and Equation 6 include both of the offset error component and the quantization error component. The values of the first digital output signal TEMPOF obtained by Equation 7 include only the quantization error component, and the offset error component is removed from the values. Accordingly, the temperature sensor 500d can effectively remove the offset error component included in the oscillation signal OSC' by performing a second order quantization noise shaping operation as expressed in Equation 7. As the offset error is corrected, the first digital output signal TEMPOF having the improved accuracy and reliability can be generated.

Figure 24:
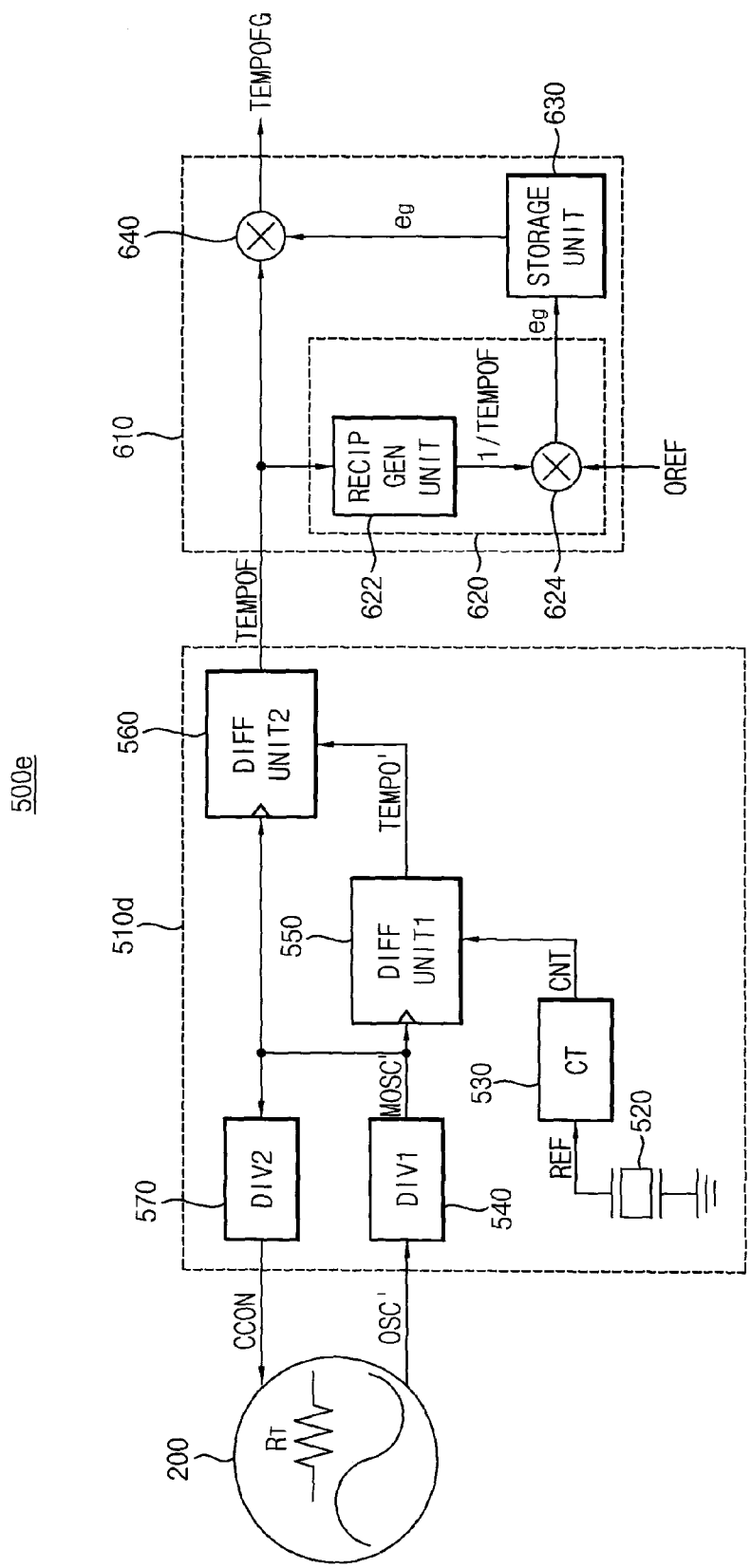
FIG. 24 is a block diagram illustrating a temperature sensor according to at least one example embodiment.

FIG. 24 is a block diagram illustrating a temperature sensor according to example embodiments.

Referring to FIG. 24, the temperature sensor 500e includes a temperature controlled oscillator 200, and A/D conversion circuit 510d, and a gain correction circuit 610.

The temperature sensor 500e of FIG. 24 may be substantially identical to the temperature sensor 500d of FIG. 22 except that the temperature sensor 500e further includes the gain correction circuit 610.

The gain correction circuit 610 may generate a second digital output signal TEMPOFG based on a first digital output signal TEMPOF and a reference output signal OREF. As described with reference to FIGS. 22 and 23, the first digital output signal TEMPOF is a signal generated after an offset error has been corrected, and the reference output signal OREF represents a reference digital output value to be output from the temperature sensor 500e when a present temperature is a reference temperature T0. The second digital output signal TEMPOFG is a signal generated after both of an offset error and a gain error have been corrected. The gain correction circuit 610 may include a first operation unit 620, a storage unit 630, and a second operation unit 640.

The first operation unit 620 may calculate a gain correction value $e_g$ by dividing the reference output signal OREF by the first digital output signal TEMPOF. The first operation unit 620 may include a reciprocal number generation unit 622 to generate a reciprocal number (1/TEMPOF) of the first digital output signal TEMPOF, and a mixer 624 to generate a corrected gain value $e_g$ by multiplying a reciprocal number (1/TEMPOF) of the first digital output signal TEMPOF by the reference output signal OREF.

The storage unit 630 may store the corrected gain value $e_g$. The storage unit 630 may include a predetermined storage unit such as a volatile memory or a non-volatile memory. According to example embodiments, the storage unit 630 may be placed outside the temperature sensor 500e.

The second operation unit 640 may generate the second digital output signal TEMPOFG by multiplying the first digital output signal TEMPOF by the corrected gain value $e_g$. The second operation unit 640 may be implemented in the form of a mixer.

In general, the gain error may be caused by RC variation. The temperature sensor 500e performs a 1-point calibration scheme with respect to the first digital output signal TEMPOF obtained after the offset error has been corrected, thereby correcting the gain error based on the reference output signal OREF to generate the second digital output signal TEMPOFG having the improved accuracy and reliability.

Figure 25:
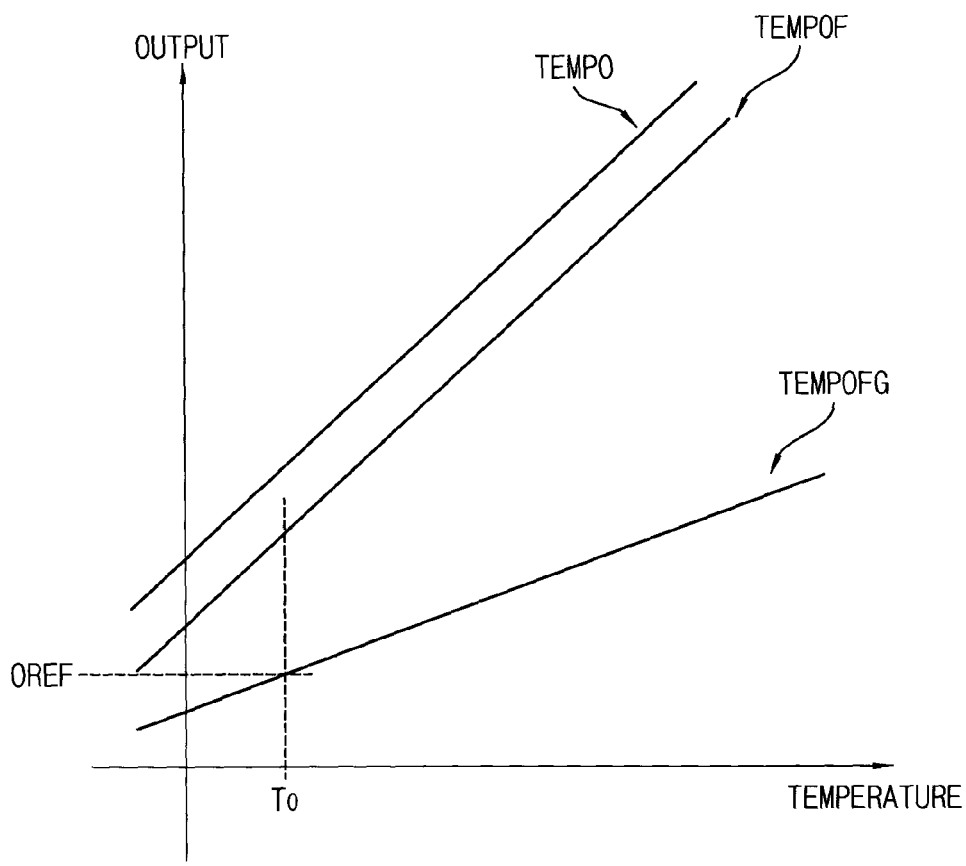
FIG. 25 is a graph to explain the operations of the temperature sensors of FIGS. 16, 22, and 24.

FIG. 25 is a graph to explain the operations of the temperature sensors of FIGS. 16, 22, and 24.

Referring to FIGS. 16, 22, 24, and 25, the digital output signal TEMPO generated from the temperature sensor 500a is a signal having the offset error caused by the parasitic delay and the gain error caused by the RC variation. The digital output signal TEMPOF generated from the temperature sensor 510d is a signal generated after the offset error has been corrected. The digital output signal TEMPOFG generated from the temperature sensor 500e is a signal generated after both of the offset error and the gain error have been corrected. Accordingly, the temperature sensor 500e may output a value corresponding to the reference output signal OREF at a reference temperature $T_0$.

Figure 26:
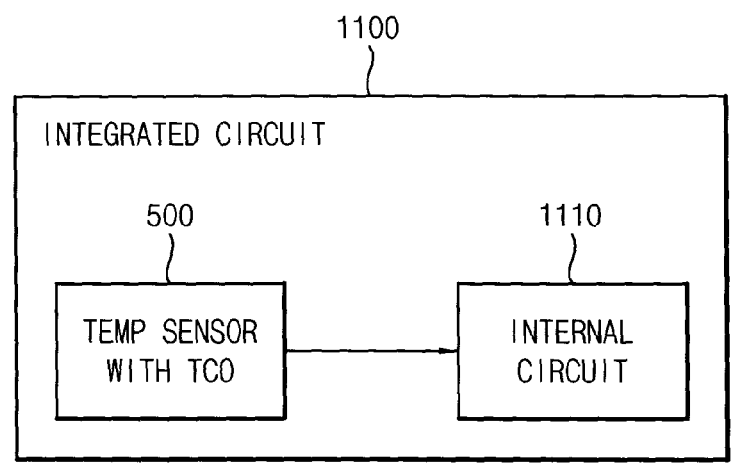
FIG. 26 is a block diagram illustrating an integrated circuit according to at least one example embodiment.

FIG. 26 is a block diagram illustrating an integrated circuit according to example embodiments.

Referring to FIG. 26, an integrated circuit 1100 includes a temperature sensor 500 and an internal circuit 1110.

The temperature sensor 500 includes temperature controlled oscillators 100 and 200 including on-chip metal resistors RT, so that the temperature sensor 500 can accurately and effective generate a digital output signal proportional to the temperature. The temperature sensor 500 can have the smaller and simpler configuration. The temperature sensor 500 corrects an offset error and a gain error based on a correction control signal CCON and/or a reference output signal OREF, thereby improving the accuracy and the reliability of a digital output signal. The internal circuit 1110 may be driven or perform a specific operation based on the output signal from the temperature sensor 500.

Figure 27:
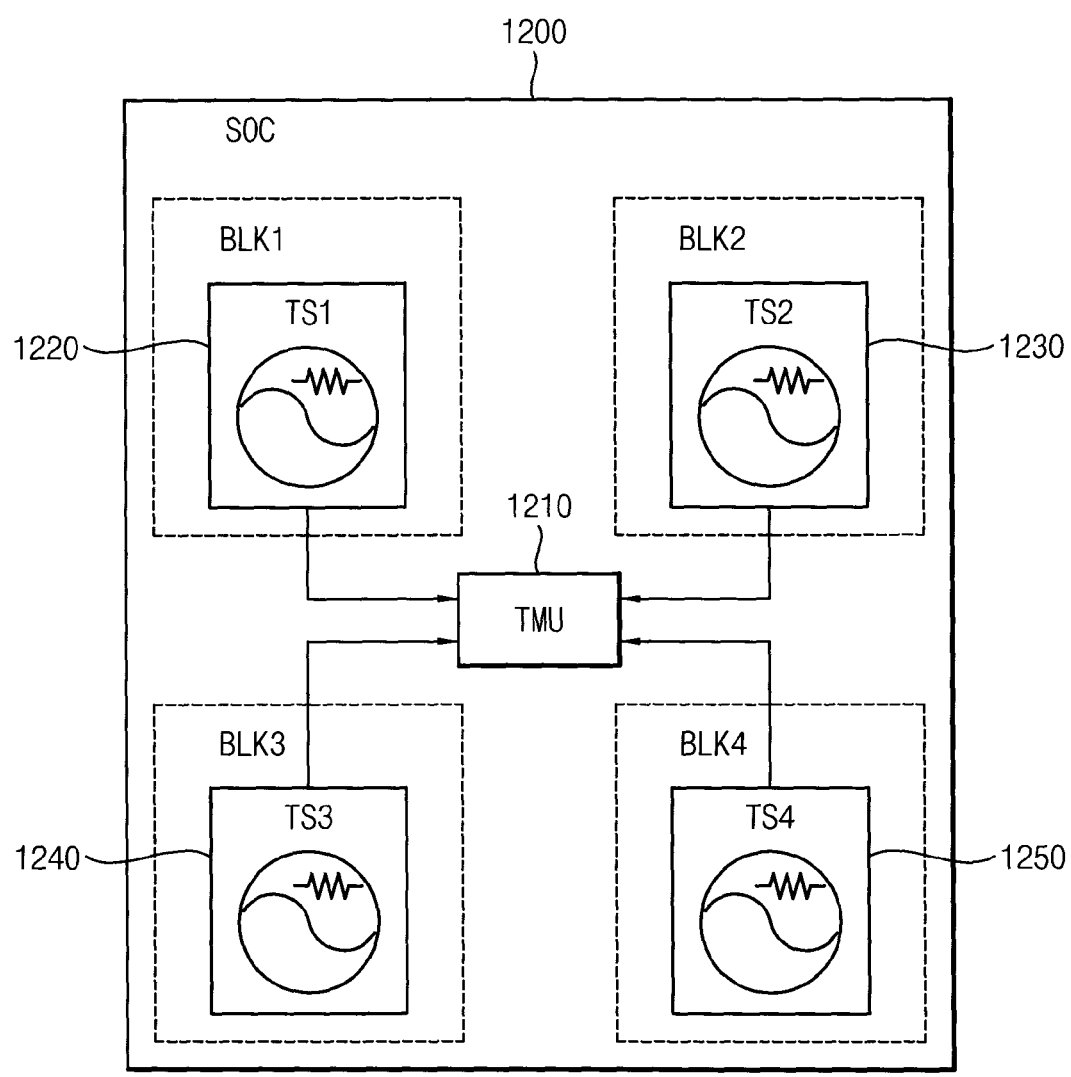
FIG. 27 is a block diagram illustrating a System-on-Chip including the temperature sensor according to at least one example embodiment.

FIG. 27 is a block diagram illustrating a System-on-Chip including the temperature sensor according to example embodiments.

Referring to FIG. 27, a System-on-Chip (SoC) 1200 may include a temperature management unit 1210 and temperature sensors 1220, 1230, 1240, and 1250. According to example embodiments, the SoC 1200 may include an application processor (AP), a microprocessor, a central processing unit (CPU), an application-specific integrated circuit (ASIC), a mobile SoC, a multimedia SoC, a device similar thereto, or a system similar thereto.

The SoC 1200 may include a plurality of sub-blocks BLK1, BLK2, BLK3, and BLK4 classified based on the intrinsic functions thereof. For example, each of the sub-blocks BLK1, BLK2, BLK3, and BLK4 may include one of a core block including a processor and a memory controller, a display control block, a file system block, a graphic processing unit (GPU) block, an image signal processing block, and a multi-format CODEC block. Since each of the sub-blocks BLK1, BLK2, BLK3, and BLK4 serves as an independent heat source, it may be necessary to not only perform the overall temperature management of the SoC 1200, but also monitor and control the temperature of each of the sub-blocks BLK1, BLK2, BLK3, and BLK4.

Temperature sensors 1220, 1230, 1240, and 1250 may include one of temperature sensors 500a, 500b, 500c, 500d, and 500e of FIGS. 16, 18, 20, and 22, respectively. The temperature sensors 1220, 1230, 1240, and 1250 include on-chip metal resistors $R_T$, so that the temperature sensors 1220, 1230, 1240, and 1250 can have the smaller and simpler configuration and can accurately and effectively generate a digital output signal proportional to the temperature. In addition, the temperature sensors 1220, 1230, 1240, and 1250 correct an offset error and/or a gain error based on the correction control signal CCON and/or the reference output signal OREF, thereby improving the accuracy and the reliability of the digital output signal. Although FIG. 27 illustrates four temperature sensors for the convenience of explanation, the number and the arrangement of temperature sensors may be variously changed according to the configuration of the SoC 1200.

The temperature management unit 1210 provides temperature information of the SoC 1200 based on the output signals generated from the temperature sensors 1220, 1230, 1240, and 1250. The temperature information may be stored in the temperature management unit 1210 and may be provided to a processor (not illustrated) in the SoC 1200. The temperature management unit 1210 may generate an interrupt signal based on the stored temperature information. The processor may analyze the temperature distribution of the SoC 1200 based on the interrupt signal and the provided temperature information and may execute an interrupt service routine to take a proper action.

Figure 28:
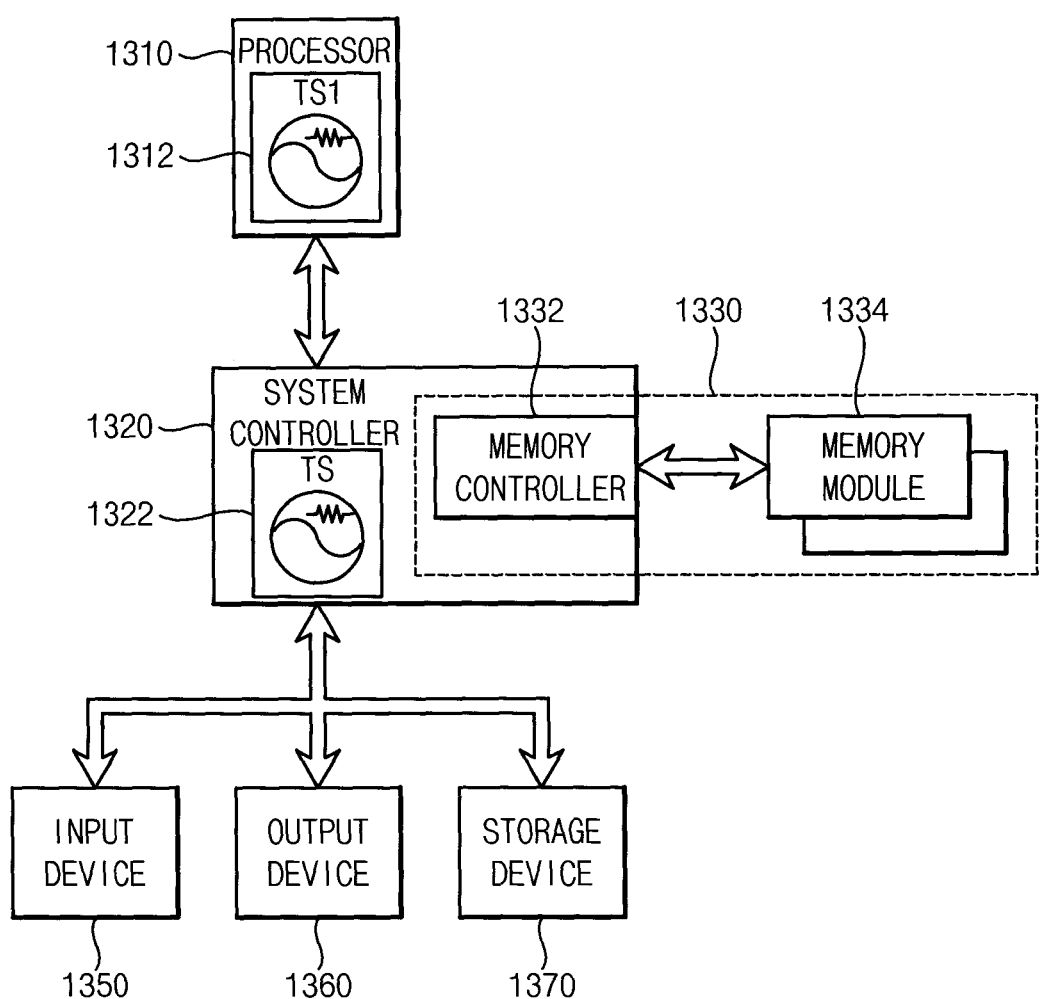
FIG. 28 is a block diagram illustrating a memory system including the temperature sensor according to at least one example embodiment.

FIG. 28 is a block diagram illustrating a memory system including the temperature sensor according to example embodiments.

Referring to FIG. 28, the memory system 1300 includes a processor 1310, a system controller 1320, and a memory device 1330. The memory system 1300 may include an input device 1350, an output device 1360, and a storage device 1370.

The memory device 1330 includes a plurality of memory module 1334 and a memory controller 1332 to control the memory modules 1334. The memory modules 1334 include at least one volatile memory or at least one non-volatile memory. The memory controller 1332 may be included in the system controller 1320.

The processor 1310 may execute specific computations or specific tasks. The processor 1310 may be connected with the system controller 1320 through a processor bus. The system controller 1320 may be connected with the input device 1350, the output device 1360, and the storage device 1370 through an expansion bus. Accordingly, the processor 1310 may control the input device 1350, the output device 1360, or the storage device 1370 through the system controller 1320.

The processor 1310 and the system controller 1320 may include temperature sensors 1312 and 1322, respectively. The temperature sensors 1312 and 1322 include on-chip metal resistors $R_T$, so that the temperature sensors 1312 and 1322 can accurately and effectively generate a digital output signal proportional to the temperature in the smaller and simpler configuration. The temperature sensors 1312 and 1322 correct an offset error and/or a gain error based on the correction control signal CCON and/or the reference output signal OREF, thereby improving the accuracy and the reliability of the digital output signal.

Figure 29:
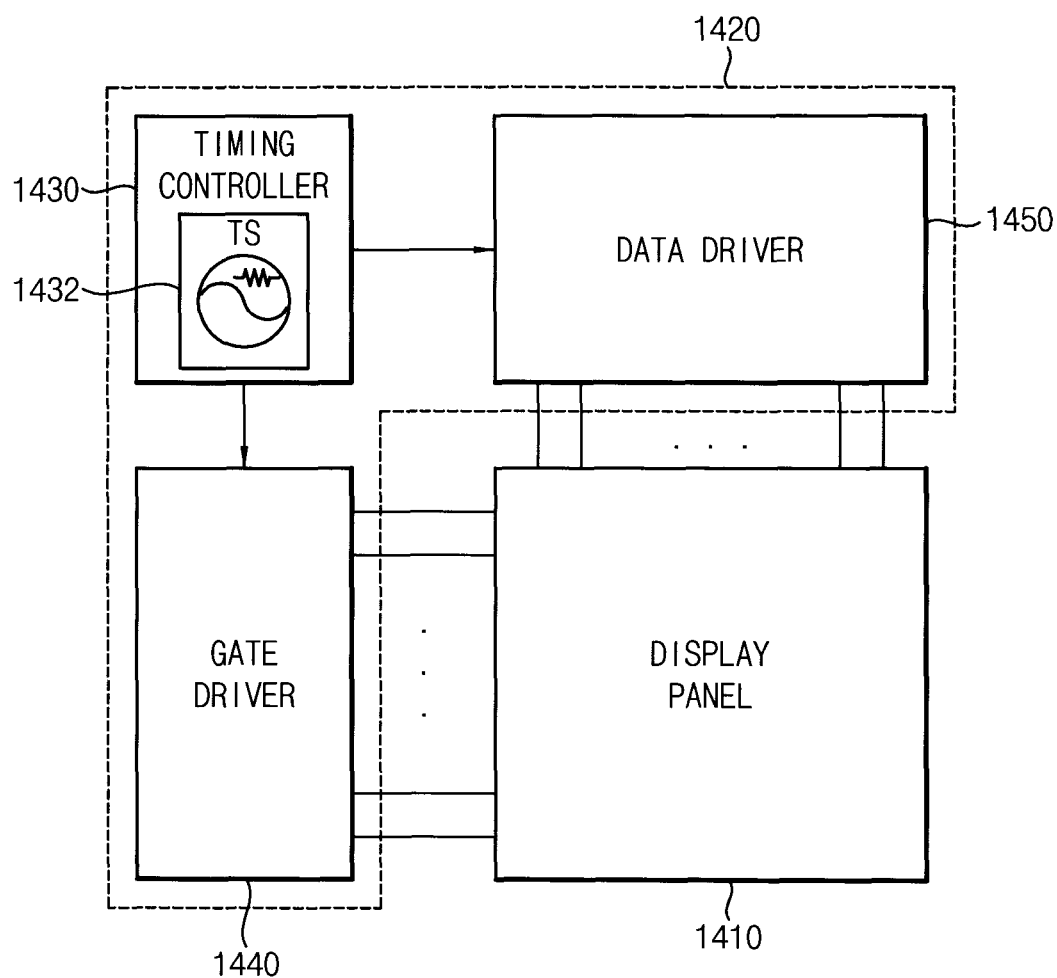
FIG. 29 is a block diagram illustrating a display system including the temperature sensor according to at least one example embodiment.

FIG. 29 is a block diagram illustrating a display system including the temperature sensor according to example embodiments.

Referring to FIG. 29, a display system 1400 includes a display panel 1410, a display driver integrated circuit (DDI) 1420.

The display panel 1410 includes a plurality of gate lines and a plurality of data line pixels, and includes a plurality of pixels defined at regions in which each of the gate lines cross each of the data lines. The pixels may be arranged in the form of a matrix to form a pixel array. The display panel 1410 may include an LCD panel, an LED panel, an OLED panel, and an FED panel.

The DDI 1420 controls the driving of the display panel 1410. The DDI 1420 may include a timing controller 1430, a gate driver 1440, and a data driver 1450.

The timing controller 1430 generates a gate driver control signal, a data driver control signal, and data, based on an image data signal and a system control signal received from an external device such as a GPU. The gate driver 1440 selects rows of the pixel array by selectively activating the gate lines of the display panel 1410 based on the gate driver control signal. The data driver 1450 applies a plurality of driving voltages to the data lines of the display panel 1410 based on the data driver control signal and the data. The display panel

1410 is driven by the operations of the gate driver 1440 and the data driver 1450 to display an image corresponding to the image data signal.

The timing controller 1430 may include a temperature sensor 1432. The temperature sensor 1432 includes an on-chip metal resistor $R_T$, so that the temperature sensor 1432 can accurately and effectively generate a digital output signal proportional to the temperature in the smaller and simpler configuration. The temperature sensor 1432 corrects an offset error and/or a gain error based on a correction control signal CCON and/or a reference output signal OREF, thereby improving the accuracy and the reliability of the digital output signal.

Figure 30:
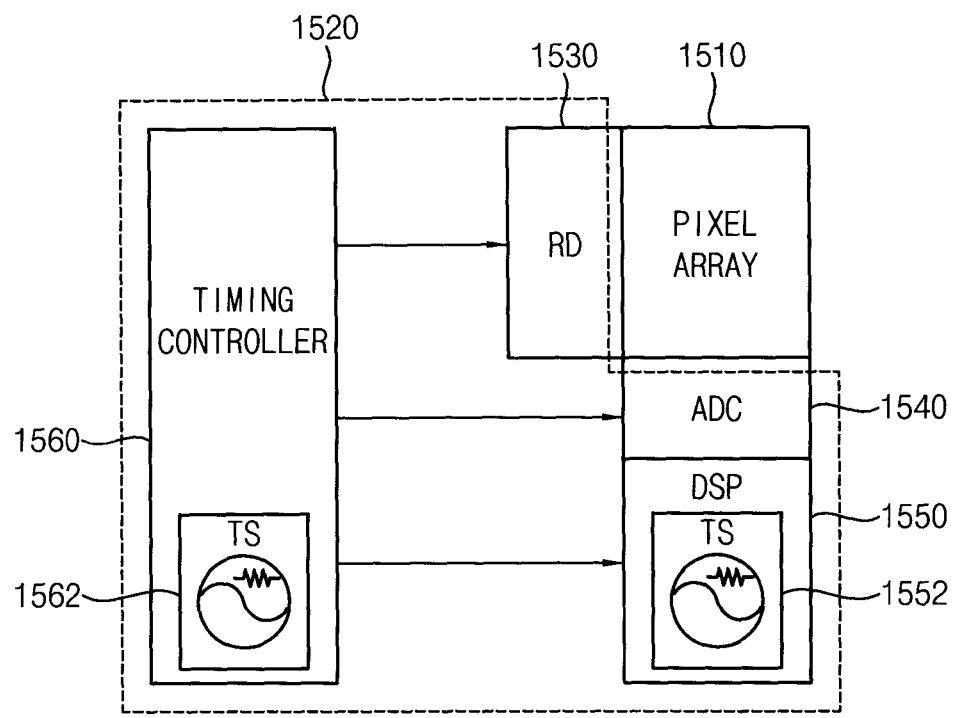
FIG. 30 is a block diagram illustrating an image sensor including the temperature sensor according to at least one example embodiment.

FIG. 30 is a block diagram illustrating an image sensor including the temperature sensor according to example embodiments.

Referring to FIG. 30, an image sensor 1500 includes a pixel array 1510 and a signal processing unit 1520.

The pixel array 1510 generates an electrical signal by converting incident light. The pixel array 1510 may include a plurality of unit pixels arranged in the form of a matrix. The unit pixels may include color pixels to provide color image information and/or distance pixels to provide distance information to a subject (not illustrated). When the pixel array 1510 includes the distance pixels, the image sensor 1500 may further include a light source to irradiate light to the subject.

The signal processing unit 1520 processes the electrical signal to generate image data. The signal processing unit 1520 may include a row driver (RD) 1530, an analogue-digital converter (ADC) 1540, a digital signal processor (DSP) 1550, and a timing controller 1560.

The RD 1530 may be connected with each row of the pixel array 1510 to generate a driving signal to drive the row of the pixel array 1510. The ADC 1540 may be connected with each column of the pixel array 1510 to convert an analog signal pixel array 1510 output from the pixel array 1510 to a digital signal. According to example embodiments, the ADC 1540 may include a correlation double sampling (CDS) unit to extract an effective signal component. The CDS unit may perform an analogue double sampling operation, a digital double sampling operation, and a dual correlation double sampling operation including both of the analogue and digital double sampling operations. The DSP 1550 may receive the digital signal output from the ADC 1540 to perform an image data processing operation with respect to the digital signal. The timing controller 1560 may apply control signals to the RD 1530, the ADC 1540, and the DSP 1550.

The DSP 1550 and the timing controller 1560 may include temperature sensors 1552 and 1562, respectively. The temperature sensors 1552 and 1562 include on-chip metal resistors $R_T$, so that the temperature sensors 1552 and 1562 can accurately and effectively generate a digital output signal proportional to the temperature in the smaller and simpler configuration. The temperature sensors 1552 and 1562 correct an offset error and/or a gain error based on a correction control signal CCON and/or a reference output signal OREF, thereby improving the accuracy and the reliability of the digital output signal.

Figure 31:
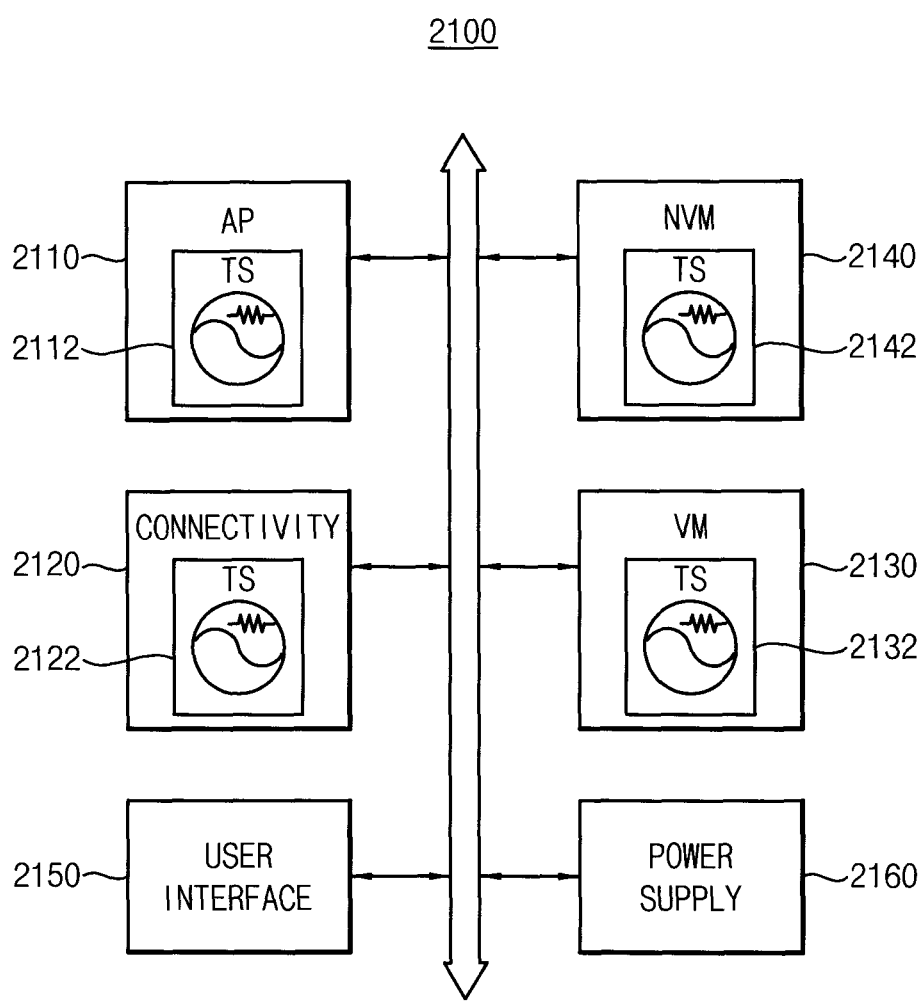
FIG. 31 is a block diagram illustrating an example that the temperature sensor according to at least one example embodiment is applied to a mobile system.

FIG. 31 is a block diagram illustrating an example that the temperature sensor according to example embodiments is applied to a mobile system.

Referring to FIG. 31, a mobile system 2100 includes an application processor (AP) 2110, a connectivity unit 2120, a volatile memory device 2130, a non-volatile memory device 2140, a user interface 2150, and a power supply 2160. According to example embodiments, the mobile system 2100 may include a predetermined mobile system such as a mobile phone, a smart phone, a personal digital assistant (PDA), a portable multimedia player (PMP), a digital camera, a music player, a portable game console, or a navigation system.

The AP 2110 may execute applications to provide an Internet browser, a game, or a moving picture. According to example embodiments, the AP 2110 may include a single core or multi-cores. For example, the AP 2110 may include multi-cores such as a dual-core, a quad-core, and a hexa-core. In addition, according to example embodiments, the AP 2110 may include an internal cache memory or an external cache memory.

The connectivity unit 2120 may make wireless communication or wired communication with an external device. For example, the connectivity unit 2120 may make Ethernet communication, near field Communication (NFC), radio frequency identification; (RFID) communication, mobile telecommunication, memory card communication, or universal serial bus (USB) communication. For example, the connectivity unit 2120 may include a baseband chipset, and may support communication such as GSM, GPRS, WCDMA, or HSxPA.

The volatile memory device 2130 may store data processed by the AP 2110 or may operate as a working memory. For example, the volatile memory device 2130 may be implemented in the form of a dynamic random access memory (DRAM), a static random access memory (SRAM), a mobile DRAM, a DDR SDRAM, an LPDDR SDRAM, a GDDR SDRAM, a RDRAM, or a memory similar thereto.

The non-volatile memory device 2140 may store a boot image used to boot the mobile system 2100. For example, the non-volatile memory device 2140 may be implemented in the form of an electrically erasable programmable read-only memory (EEPROM), a flash memory, a phase change random access memory (PRAM), an resistance value random access memory (RRAM), a nano-floating gate memory (NFGM), a polymer random access memory (PoRAM), a magnetic random access memory (MRAM), a ferroelectric random access memory (FRAM) or a memory similar thereto.

The AP 2110, the connectivity unit 2120, the volatile memory device 2130, and the non-volatile memory device 2140 may include the temperature sensors 2112, 2122, 2132, and 2142, respectively. The temperature sensors 2112, 2122, 2132, and 2142 include on-chip metal resistors $R_T$, so that the temperature sensors 2112, 2122, 2132, and 2142 can have the smaller and simpler configuration and can accurately and effectively generate a digital output signal proportional to the temperature. In addition, the temperature sensors 2112, 2122, 2132, and 2142 correct an offset error and/or a gain error based on a correction control signal CCON and/or a reference output signal OREF, thereby improving the accuracy and the reliability of the digital output signal.

The user interface 2150 may include at least one input device such as a keypad or a touch screen, and/or at least one output device such as a speaker or a display device. The power supply 2160 may supply the operating voltage of the mobile system 2100. In addition, according to example embodiments, the mobile system 2100 may further a camera image processor (CIS), and may further include a storage device such as a memory card, a solid state drive (SSD), a hard disk drive (HDD), or a CD-ROM.

The mobile system 2100 or the components of the mobile system 2100 may be mounted by using various types of packages. For example, the mobile system 2100 or the components of the mobile system 2100 may be mounted by using a package such as package on package (PoP), ball grid arrays (BGAs), chip scale packages (CSPs), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat-pack (TQFP), small outline integrated circuit (SOIC), shrink small outline package (SSOP), thin small outline package (TSOP), thin quad flat-pack (TQFP), system in package (SIP), multi chip package (MCP), wafer-level fabricated package (WFP), or wafer-level processed stack package (WSP).

Figure 32:
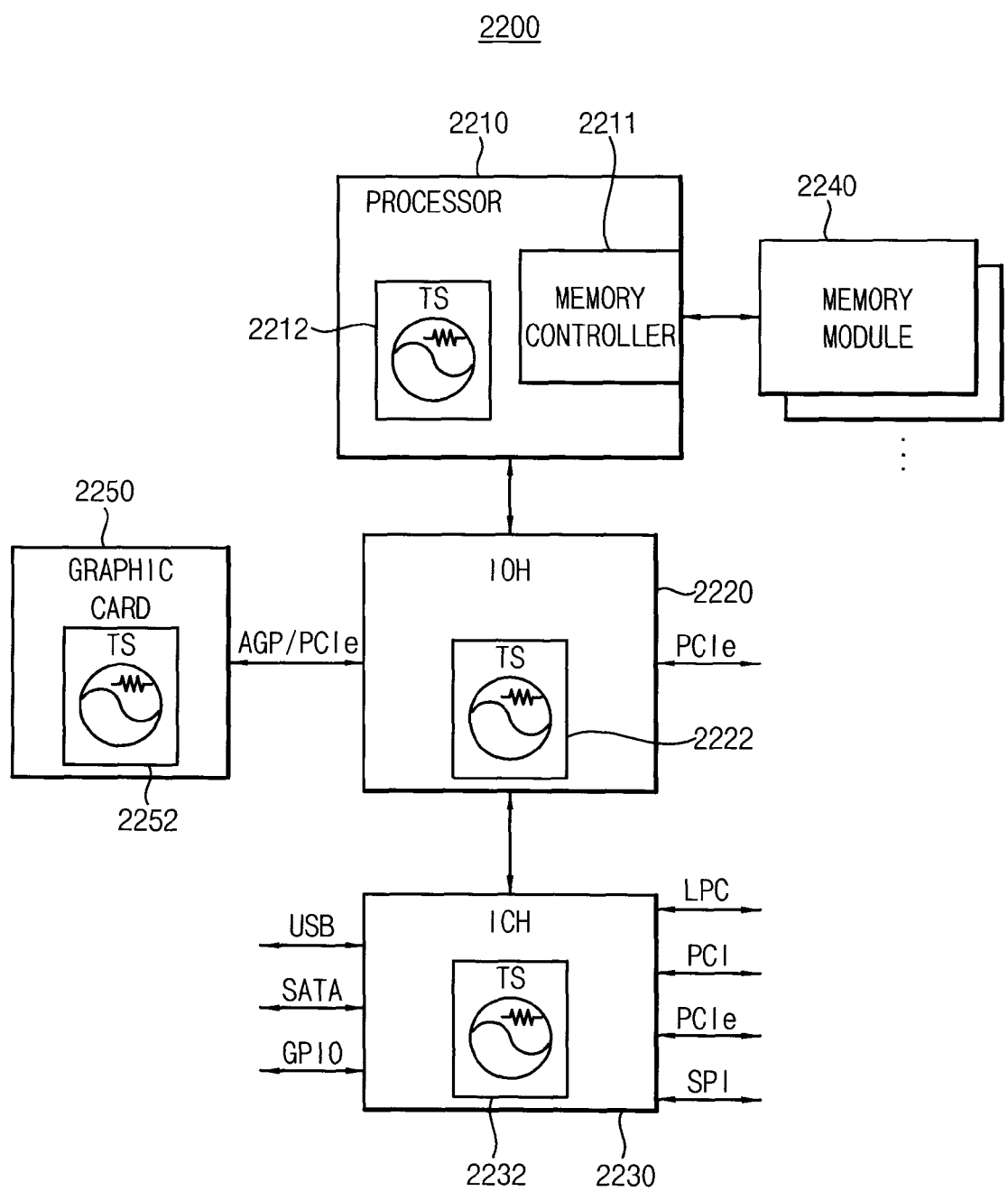
FIG. 32 is a block diagram illustrating an example that the temperature sensor according to at least one example embodiment is applied to a computing system.

FIG. 32 is a block diagram illustrating an example that the temperature sensor according to example embodiments is applied to a computing system.

Referring to FIG. 32, a computing system 2200 includes a processor 2210, an input/output hub 2220, an input/output controller hub 2230, at least one memory module 2240, and a graphic card 2250. According to example embodiments, the computing system 2200 may be a predetermined computing system such as a personal computer (PC), a server computer, a workstation, a Laptop, a mobile phone, a smart phone, a personal digital assistant (PDA), a portable multimedia player (PMP), a digital camera, a camcorder, a digital television (digital TV), a set-top box, a music player, a portable game console, or a navigation system.

The processor 2210 may execute various computing functions such as specific computations or specific tasks. For example, the processor 2210 may include a micro-processor or a central processing unit (CUP). According to example embodiments, the processor 2210 may include a single core or a plurality of multi-cores. In addition, according to example embodiments, the computing system 2200 may include a plurality of processors. Further, according to example embodiments, the processor 2210 may further include an internal cache memory or an external cache memory.

The processor 2210 may include a memory controller 2211 to control the operation of the memory module 2240. The memory controller 2211 included in the processor 2210 may be called an integrated memory controller (IMC). A memory interface between the memory controller 2211 and the memory module 2240 may be implemented by using one channel including a plurality of signal lines or a plurality of channels. In addition, each channel may be connected with at least one memory module 2240. According to example embodiments, the memory controller 2211 may be placed inside the input/output hub 2220. The input/output hub 2220 including the memory controller 2211 may be called a memory controller hub (MCH). The memory module 2240 may include a plurality of volatile memories or non-volatile memories to store data provided from the memory controller 2211.

The input/output hub 2220 may manage data transfer between devices such as the graphic card 2250 and the processor 2210. The input/output hub 2220 may be connected with the processor 2210 through various types of interfaces. For example, the input/output hub 2220 may be connected with the processor 2210 through various standard interfaces such as a front side bus (FSB) a system bus, a hyper transport, lightening data transport (LDT), a quick path interconnect (QPI), and a common system interface (CSI). According to example embodiments, the computing system 2200 may include a plurality of input/output hubs.

The input/output hub 2220 may provide various interfaces with devices. For example, the input/output hub 2220 may provide interfaces such as an accelerated graphics terminal (AGP) interface, a peripheral component interface-express (PCIe), and a communication streaming architecture (CSA).

The graphic card 2250 may be connected with the input/output hub 2220 through the AGP or the PCIe. The graphic card 2250 may control a display device (not illustrated) to display an image. The graphic card 2250 may include an internal processor and an internal semiconductor memory device to process image data. According to example embodiments, the input/output hub 2220 may be provided together with the graphic card 2250 placed outside the input/output hub 2220, or may be provided therein with a graphic device instead of the graphic card 2250. The graphic device included in the input/output hub 2220 may be called integrated graphics. In addition, the input/output hub 2220 including the memory controller and the graphic device may be graphics and memory controller hub (GMCH).

The input/output controller hub 2230 may perform a data buffering operation and an interface arbitration operation so that various system interfaces are effectively operated. The input/output controller hub 2230 may be connected with the input/output hub 2220 through an internal bus. For example, the input/output hub 2220 and the input/output controller hub 2230 may be connected with each other through an direct media interface (DMI), a hub interface, an enterprise south bridge interface (ESI), or a PCIe.

The input/output controller hub 2230 may provide various interfaces with peripheral devices. For example, the input/output controller hub 2230 may provide a universal serial bus (USB) port, a serial advanced technology attachment (SATA) port, a general purpose input/output (GPIO), a low pin count (LPC) bus, a serial peripheral interface (SPI), a PCI, and a PCIe.

The processor 2210, the input/output hub 2220, the input/output controller hub 2230, and the graphic card 2250 may include temperature sensors 2212, 2222, 2232, and 2252, respectively. The temperature sensors 2212, 2222, 2232, and 2252 include on-chip metal resistors $R_T$, so that the temperature sensors 2212, 2222, 2232, and 2252 can have the smaller and simpler configuration and can accurately and effectively generate a digital output signal proportional to the temperature. In addition, the temperature sensors 2212, 2222, 2232, and 2252 correct an offset error and/or a gain error based on a correction control signal CCON and/or a reference output signal OREF, thereby improving the accuracy and the reliability of the digital output signal.

According to example embodiments, the processor 2210, the input/output hub 2220, and the input/output controller hub 2230 may be separately implemented in an individual chip set, or may be implemented in integrated circuits. Alternately, the components of at least two of the processor 2210, the input/output hub 2220, and the input/output controller hub 2230 may be implemented in one chip set.

Example embodiments are applicable to a predetermined device and a predetermined system including temperature controlled oscillators and temperature sensors. For example, the example embodiments may be usefully employed to various electronic appliances such as a cellular phone, a smart phone, a PDA, a PMP, a digital camera, a camcorder, a PC, a server computer, a workstation, a laptop computer, a digital TV, a set-top box, a music player, a portable game console, a navigation system, a smart card, and a printer.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of inventive concepts. Accordingly, all such modifications are intended to be included within the scope of inventive concepts as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A temperature controlled oscillator comprising:
an oscillation unit configured to generate at least one reference voltage based on a supply voltage and a ground voltage, and to generate an oscillation signal having a period varying according to a temperature, the oscillation unit configured to generate the oscillation signal based on a filter voltage and the at least one reference voltage; and
a filter unit configured to generate the filter voltage based on the oscillation signal, the filter unit including,
an on-chip metal resistor having a first terminal connected with a first node, the on-chip metal resistor having a resistance value that varies according to the temperature,
a capacitor having a first terminal connected with the first node, and configured to be charged or discharged based on the oscillation signal to supply the filter voltage, and
an amplification block including a first terminal connected with a second terminal of the capacitor, a second terminal connected with the ground voltage, and a third terminal connected with the first node.

2. The temperature controlled oscillator of claim 1, wherein the oscillation unit is configured to increase the period of the oscillation signal if the temperature is increased, and decrease the period of the oscillation signal if the temperature is decreased.

3. The temperature controlled oscillator of claim 1, wherein the oscillation unit comprises:
a first resistor connected between the supply voltage and a second node;
a second resistor connected between the second node and the ground voltage;
a comparator including a first input terminal connected with the first node, a second input terminal connected with the second node, and an output terminal configured to output the oscillation signal; and
a third resistor connected between the second node and the output terminal of the comparator,
wherein a second terminal of the on-chip metal resistor is connected with the output terminal of the comparator.

4. The temperature controlled oscillator of claim 3, wherein the oscillation unit is configured to generate a voltage at the second node as a first reference voltage, the first reference voltage has one of a first reference level and a second reference level lower than the first reference level according to a level of the filter voltage, and the oscillation unit is configured to activate the oscillation signal if the level of the filter voltage is higher than the first reference level or the level of the filter voltage is lower than the second reference level.

5. A temperature controlled oscillator comprising:
an oscillation unit configured to generate at least one reference voltage based on a supply voltage and a ground voltage, and to generate an oscillation signal having a period varying according to a temperature, the oscillation unit configured to generate the oscillation signal based on a filter voltage and the at least one reference voltage, the oscillation unit including,
a reference voltage generation block configured to generate a first reference voltage and a second reference voltage in response to the supply voltage and the ground voltage,
an output block configured to generate the oscillation signal based on the first reference voltage, the second reference voltage, the filter voltage, and a start signal, and
a latch block configured to latch and output the oscillation signal; and
a filter unit configured to generate the filter voltage based on the oscillation signal, the filter unit including,
an on-chip metal resistor having a first terminal connected with a first node, the on-chip metal resistor having a resistance value that varies according to the temperature, and
a capacitor having a first terminal connected with the first node, the capacitor configured to be charged or discharged based on the oscillation signal to supply the filter voltage,
wherein a second terminal of the on-chip metal resistor is connected with an output terminal of the latch block.

6. The temperature controlled oscillator of claim 5, wherein the reference voltage generation block comprises:
a first resistor connected between the supply voltage and a second node;
a second resistor connected between the second node and a third node; and
a third resistor connected between the third node and the ground voltage,
wherein a voltage at the second node is the first reference voltage, and a voltage at the third node is the second reference voltage.

7. The temperature controlled oscillator of claim 5, wherein the output block comprises:
a first comparator including a first input terminal configured to receive the first reference voltage, a second input terminal connected with the first node, and an output terminal configured to output a first comparative signal;
a second comparator including a first input terminal connected with the first node, a second input terminal configured to receive the second reference voltage, and an output terminal configured to output a second comparative signal;
a first NOR gate configured to perform a NOR operation with respect to the first comparative signal and the second comparative signal;
an inverter to invert the start signal; and
a second NOR gate configured to perform a NOR operation with respect to an output signal from the first NOR gate and an output signal from the inverter to generate the oscillation signal.

8. The temperature controlled oscillator of claim 7, wherein the oscillation unit activates the oscillation signal if a level of the filter voltage is higher than a level of the first reference voltage or lower than a level of the second reference voltage.

9. The temperature controlled oscillator of claim 5, wherein the latch block comprises a flip-flop including a clock terminal configured to receive the oscillation signal, an output terminal connected with the on-chip metal resistor, and a data terminal connected with an inverting output terminal.

10. A temperature controlled oscillator comprising:
an oscillation unit configured to generate at least one reference voltage based on a supply voltage and a ground voltage, and to generate an oscillation signal having a period that varies according to a temperature, the oscillation unit configured to generate the oscillation signal based on a filter voltage and the at least one reference voltage; and an adjusting unit configured to generate the filter voltage based on the oscillation signal and to adjust the period of the oscillation signal based on a correction control signal to remove an offset error included in the oscillation signal due to a parasitic delay of the oscillation unit.

11. The temperature controlled oscillator of claim 10, wherein the oscillation unit is configured to generate the oscillation signal including a first duration having a first period and a second duration having a second period longer than the first period, alternately repeated, and a number of first oscillation pulses for the first duration is equal to a number of second oscillation pulses for the second duration.

12. The temperature controlled oscillator of claim 10, wherein the adjusting unit comprises:
   a first on-chip metal resistor connected between a first node and a second node, the first on-chip metal resistor having a resistance value that varies according to the temperature;
   a second on-chip metal resistor connected between the second node and a third node, the second on-chip metal resistor having a resistance value that varies according to the temperature;
   a select block configured to electrically connect one of the second node and the third node with an output terminal of the oscillation unit in response to the correction control signal; and
   a capacitor having a first terminal connected with the first node and configured to be charged or discharged based on the oscillation signal and the correction control signal to supply the filter voltage.

13. The temperature controlled oscillator of claim 12, wherein the first on-chip metal resistor and the second on-chip metal resistor have a same resistance value, and the oscillation unit is configured to generate a first period and a second period of the oscillation signal based on the same resistance value.

14. The temperature controlled oscillator of claim 10, wherein the adjusting unit comprises:
   an on-chip metal resistor having a first terminal connected with a first node, the on-chip metal resistor having a resistance value that varies according to the temperature;
   a first capacitor having a first terminal connected with the first node and configured to be charged or discharged based on the oscillation signal to supply the filter voltage;
   a second capacitor having a first terminal connected with the first node; and
   a select block configured to selectively connect a second terminal of the first capacitor with a second terminal of the second capacitor in response to the correction control signal.

15. The temperature controlled oscillator of claim 14, wherein the first capacitor and the second capacitor have a same capacitance, and the oscillation unit is configured to generate a first period and a second period of the oscillation signal based on the same capacitance.

16. The temperature controlled oscillator of claim 10, wherein the adjusting unit comprises:
   a first on-chip metal resistor having a first terminal connected with a first node, the first on-chip metal resistor having a resistance value that varies according to the temperature;
   a second on-chip metal resistor connected between the first node and a second node, the second on-chip metal resistor and having a resistance value that varies according to the temperature;
   a select block configured to electrically connect one of the first node and the second node with a third node in response to the correction control signal; and
   a capacitor having a first terminal connected with the third node and configured to be charged or discharged based on the oscillation signal and the correction control signal to supply the filter voltage.

17. A temperature sensor comprising:
   a temperature controlled oscillator configured to generate an oscillation signal having a period that varies according to a temperature of the oscillator; and
   an analog-digital conversion circuit configured to generate a digital output signal corresponding to the temperature based on the oscillation signal and a reference oscillation signal,
   the temperature controlled oscillator including,
      an oscillation unit configured to generate at least one reference voltage based on a supply voltage and a ground voltage, and to generate the oscillation signal based on a filter voltage and the at least one reference voltage, and
      a filter unit configured to generate the filter voltage based on the oscillation signal, the filter unit including,
         an on-chip metal resistor having a first terminal connected with a first node, the on-chip metal resistor having a resistance value that varies according to the temperature, and
         a capacitor having a first terminal connected to the first node, and configured to be charged or discharged based on the oscillation signal to supply the filter voltage.

18. The temperature sensor of claim 17, wherein the analog-digital conversion circuit comprises:
   a local oscillator configured to generate the reference oscillation signal;
   a counter configured to generate a sequentially increasing count signal based on the reference oscillation signal;
   a divider configured to generate a division signal by dividing the oscillation signal; and
   a difference unit configured to generate the digital output signal by obtaining a count value of the count signal at every rising edge or every falling edge of the division signal.

19. The temperature sensor of claim 17, wherein the analog-digital conversion circuit comprises:
   a local oscillator configured to generate the reference oscillation signal;
   a divider configured to generate a division signal by dividing the oscillation signal;
   a counter configured to generate a sequentially increasing count signal based on the reference oscillation signal; and
   a register configured to generate the digital output signal by obtaining a count value of the count signal at every rising edge or every falling edge of the division signal.

20. The temperature sensor of claim 17, wherein the analog-digital conversion circuit comprises:
   a local oscillator configured to generate the reference oscillation signal;
   a divider configured to generate a division signal by dividing the reference oscillation signal;
   a counter configured to generate a sequentially increasing count signal based on the oscillation signal; and a register configured to generate the digital output signal by obtaining a count value of the count signal at every rising edge or every falling edge of the division signal.

21. A temperature sensor comprising:
a temperature controlled oscillator to generate an oscillation signal having a period that varies according to a temperature of the oscillator and configured to adjust the period of the oscillation signal based on a correction control signal; and
an analog-digital conversion circuit configured to generate a first digital output signal corresponding to the temperature and to generate the correction control signal based on the oscillation signal and a reference oscillation signal,
the temperature controlled oscillator including,
an oscillation unit configured to generate at least one reference voltage based on a supply voltage and a ground voltage, and to generate the oscillation signal based on a filter voltage and the at least one reference voltage, and
an adjusting unit configured to generate the filter voltage based on the oscillation signal and to adjust the period of the oscillation signal based on the correction control signal to remove an offset error included in the oscillation signal due to a parasitic delay of the oscillation unit.

22. The temperature sensor of claim 21, wherein the analog-digital conversion circuit comprises:
a local oscillator configured to generate the reference oscillation signal;
a counter configured to generate a sequentially increasing count signal based on the reference oscillation signal;
a first divider configured to generate a division signal based on the oscillation signal;
a first difference unit configured to generate a second digital output signal by obtaining a count value of the count signal at every rising edge or every falling edge of the division signal;
a second difference unit configured to generate the first digital output signal by obtaining a value of the second digital output signal at every rising edge or every falling edge of the division signal; and
a second divider configured to generate the correction control signal by dividing the division signal.

23. The temperature sensor of claim 21, further comprising:
a gain correction circuit configured to remove the offset error and a gain error, the gain correction circuit configured to generate the second digital output signal based on the first digital output signal and a reference output signal.

24. The temperature sensor of claim 23, wherein the gain correction circuit comprises:
a first operation unit configured to calculate a gain correction value by dividing the reference output signal by the first digital output signal;
a storage unit configured to store the gain correction value; and
a second operation unit configured to generate the second digital output signal by multiplying the first digital output signal by the gain correction value.

* * * * *